United States Patent
Zheng et al.

(10) Patent No.: US 12,336,323 B2
(45) Date of Patent: Jun. 17, 2025

(54) AVALANCHE PHOTODIODES WITH ADAPTIVE QUENCHING OF PHOTOCURRENT

(71) Applicants: The University of Chicago, Chicago, IL (US); The University of Virginia Patent Foundation, Charlottesville, VA (US)

(72) Inventors: Jiyuan Zheng, Lisle, IL (US); Supratik Guha, Chicago, IL (US); Joe C. Campbell, Charlottesville, VA (US)

(73) Assignees: The University of Chicago, Chicago, IL (US); University of Virginia Patent Foundation, Charlottesville, VA (US)

( * ) Notice: Subject to any disclaimer, the term of this patent is extended or adjusted under 35 U.S.C. 154(b) by 304 days.

(21) Appl. No.: 17/801,695

(22) PCT Filed: Mar. 2, 2021

(86) PCT No.: PCT/US2021/020516
§ 371 (c)(1),
(2) Date: Aug. 23, 2022

(87) PCT Pub. No.: WO2021/178434
PCT Pub. Date: Sep. 10, 2021

(65) Prior Publication Data
US 2023/0125317 A1 Apr. 27, 2023

Related U.S. Application Data

(60) Provisional application No. 62/985,095, filed on Mar. 4, 2020.

(51) Int. Cl.
*H01L 31/00* (2006.01)
*G01J 1/44* (2006.01)
(Continued)

(52) U.S. Cl.
CPC .............. *H10F 77/959* (2025.01); *G01J 1/44* (2013.01); *H10F 30/225* (2025.01)

(58) Field of Classification Search
CPC ............ H01L 31/02027; H01L 31/107; H04N 25/773; H03H 9/02417; G01J 2001/442; G01J 1/46; G01J 1/44
See application file for complete search history.

(56) References Cited

U.S. PATENT DOCUMENTS

| 5,532,474 A | 7/1996 | Dautet et al. |
| 5,933,042 A | 8/1999 | Trottier et al. |

(Continued)

FOREIGN PATENT DOCUMENTS

| WO | WO 88/04034 A2 | 6/1988 |
| WO | WO 91/00502 A1 | 1/1991 |

OTHER PUBLICATIONS

International Search Report mailed May 2, 2021 for International Application No. PCT/US2021/020516.
(Continued)

*Primary Examiner* — Abdullahi Nur
(74) *Attorney, Agent, or Firm* — Crowell & Moring LLP

(57) ABSTRACT

This disclosure is directed to a high-speed avalanche photodiode device configured to detect single photons. The avalanche photodiode device may include a passive quenching circuitry. The passive quenching circuitry may include a quenching resistor having a resistivity spontaneously adaptive to a bias voltage applied across the quenching resistor. Such adaptive resistivity enables a fast response time for the avalanche photodiode device when used to detect single photos in Geiger mode.

20 Claims, 20 Drawing Sheets

(51) Int. Cl.
     H10F 30/225     (2025.01)
     H10F 77/00      (2025.01)

(56) References Cited

U.S. PATENT DOCUMENTS

| | | | | |
|---|---|---|---|---|
| 10,312,274 | B1* | 6/2019 | Stark | H01L 31/107 |
| 10,584,998 | B2* | 3/2020 | Clemens | G01J 1/44 |
| 2012/0063789 | A1 | 3/2012 | Yuan et al. | |
| 2018/0180471 | A1* | 6/2018 | Marra | G01S 7/4865 |
| 2021/0092275 | A1* | 3/2021 | Gnecchi | G06T 7/521 |

OTHER PUBLICATIONS

Written Opinion mailed May 2, 2021 for International Application No. PCT/US2021/020516.

Berggren, K. et al.; "Roadmap on emerging hardware and technology for machine learning"; Nanotechnology 32, doi:10.1088/1361-6528/aba70f ; 2021; 46 pages.

Biolek, D. et al.; "Reliable SPICE Simulations of Memristors, Memcapacitors and Meminductors"; Radioengineering 22, 945-968; 2013; 37 pages.

Cova, S. et al.; "Avalanche photodiodes and quenching circuits for single-photon detection"; Appl. Opt. 35, 1956-1976, doi:10.1364/AO.35.001956; 1996; 21 pages.

Craddock, A. N. et al.; "Quantum Interference between Photons from an Atomic Ensemble and a Remote Atomic Ion"; Phys. Rev. Lett. 123, doi:10.1103/PhysRevLett.123.213601; 2019; 6 pages.

Cui, Y. et al.; in Proc. of IEEE Conference on Computer Vision and Pattern Recognition (CVPR, 2010) 1173-1180; San Francisco, CA; 2010; 8 pages.

Dalla Mora, A. et al.; "Single-photon avalanche diode model for circuit simulations"; IEEE Photon. Technol. Lett. 19, 1922-1924, doi:10.1109/LPT.2007.908768; 2007; 3 pages.

Dautet, H. et al.; "Photon-Counting Techniques with Silicon Avalanche Photodiodes"; Appl. Opt. 32, 3894-3900, doi:10.1364/AO.32.003894; 1993; 6 pages.

Devulder, W. et al.; "Combinatorial Study of Ag-Te Thin Films and Their Application as Cation Supply Layer in CBRAM Cells"; ACS Comb. Sci. 17, 334-340, doi:10.1021/acscombsci.5b00025; 2015; 7 pages.

Devulder, W. et al.; "Influence of Carbon Alloying on the Thermal Stability and Resistive Switching Behavior of Copper-Telluride Based CBRAM Cells"; ACS Appl. Mater. Interfacesc 5, 6984-6989, doi:10.1021/am4010946; 2013; 6 pages.

Ding, X. et al. "Improving characterization capabilities in new single-photon avalanche diode research"; Rev. Sci. Instrum. 90, doi:10.1063/1.5041502; 2019; 9 pages.

Eraerds, P. et al.; "SiPM for fast photon-counting and multiphoton detection"; Opt. Express 15, 14539-14549, doi:10.1364/OE.15.014539; 2007; 11 pages.

Fan, L. L. et al.; "Growth and phase transition characteristics of pure M-phase VO2 epitaxial film prepared by oxide molecular beam epitaxy"; Appl. Phys. Lett. 103, doi:10.1063/1.4823511; 2013; 6 pages.

Fujii, S. et al.; "Scaling the CBRAM Switching Layer Diameter to 30 nm Improves Cycling Endurance"; IEEE Electron. Device Lett. 39, 23-26, doi:10.1109/LED.2017..2771718; 2018; 4 pages.

Goedhart, J. et al.; "Structure-guided evolution of cyan fluorescent proteins towards a quantum yield of 93%"; Nat. Commun. 3, doi:10.1038/ncomms1738; 2012; 9 pages.

Goux, L. et al.; "Key material parameters driving CBRAM device performances"; Faraday Discuss. 213, 67-85, doi:10.1039/c8fd00115d; 2019; 19 pages.

Grisafe, B. et al.; "Performance Enhancement of Ag/HfO2 Metal Ion Threshold Switch Cross-Point Selectors"; IEEE Electron Device Lett. 40, 1602-1605, doi:10.1109/LED.2019.2936104; 2019; 4 pages.

Haitz, R. H.; "Model for Electrical Behavior of Microplasma"; J. Appl. Phys. 35, 1370-&, doi:10.1063/1.1713636; 1964; 8 pages.

Hamamatsu. Silicon photomultipliers: Theory & practice, video link: <https://hub.hamamatsu.com/us/en/webinar/sipm-theory-practice/index.html>; 2017; 3 pages.

Ielmini, D. et al.; "In-memory computing with resistive switching devices"; Nat. Electron. 1, 333-343, doi:10.1038/s41928-018-0092-2; 2018; 11 pages.

Intel; "Intel and Micron Produce Breakthrough Memory Technology"; <https://newsroom.intel.com/news-releases/intel-and-micron-produce-breakthrough-memory-technology/#gs.laqacz>; 2015; 4 pages.

Jerry, M. et al. in 2017 IEEE International Electron Devices Meeting IEEE International Electron Devices Meeting; 2017; 4 pages.

Kollorz, E. et al.; "Gesture recognition with a time-of-flight camera"; Int. J. Intel. Syst. Technol. Appl. 5, 334-343; 2008; 10 pages.

Lanza, M. et al.; "Recommended Methods to Study Resistive Switching Devices"; Adv. Electron. Mater. 5, doi:10,1002/aelm.201800143; 2019; 28 pages.

Li, C. et al.; "Long short-term memory networks in memristor crossbar arrays"; Nat. Mach. Intell. 1, 49-57, doi:10.1038/s42256-018-0001-4; 2019; 26 pages.

Li, C. et al.; "Analogue signal and image processing with large memristor crossbars"; Nat. Electron. 1, 52-59, doi:10.1038/s41928-017-0002-z; 2018; 8 pages.

Lin, Q. et al.; "Dual-Layer Selector With Excellent Performance for Cross-Point Memory Applications"; IEEE Electron. Device Lett. 39, 496-499, doi:10.1109/LED.2018.2808465; 2018; 4 pages.

Lu, Z.; "Advanced Devices and Circuits for Near Infrared Single Photon Detection Doctor of Philosophy"; thesis, University of Virginia; 2013; 145 pages.

Marano, D. et al.; "Silicon Photomultipliers Electrical Model Extensive Analytical Analysis"; IEEE Trans. Nucl. Sci. 61, 23-34, doi:10.1109/TNS.2013.2283231; 2014; 12 pages.

Meda, A. et al.; "Quantifying backflash radiation to prevent zero-error attacks in quantum key distribution"; Light Sci. Appl. 6, doi:10.1038/Isa.2016.261; 2017; 5 pages.

Menzel, S.; The ultimate switching speed limit of redox-based resistive switching devices; Faraday Discuss. 213, 197-213, doi:10.1039/c8fd00117k; 2019; 17 pages.

Midya, R. et al.; "Anatomy of Ag/Hafnia-Based Selectors with 1010 Nonlinearity"; Adv. Mater. 29, doi:10.1002/adma.20164457; 2017; 8 pages.

Savuskan, V. et al.; "Selecting Single Photon Avalanche Diode (SPAD) Passive-Quenching Resistance: An Approach"; IEEE Sens. J. 13, 2322-2328, doi:10.1109/JSEN.2013.2253603; 2013; 7 pages, Shukla, N. et al.; in 2017 IEEE International Electron Devices Meeting IEEE International Electron Devices Meeting; 2017; 4 pages.

Sonde, S. et al.; "Silicon compatible Sn-based resistive switching memory"; Nanoscale 10, 9441-9449, doi:10.1039/c8nr01540f; 2018; 9 pages.

Techella, J. et al.; "Real-time 3D reconstruction from single-photon lidar data using plug-and-play point cloud denoisers"; Nat. Commun. 10, doi:10.1038/s41467-019-12943-7; 2019; 6 pages.

Tenne, R. et al.; "Super-resolution enhancement by quantum image scanning microscopy;" Nat. Photon. 13, 116-+, doi:10.1038/s41566-018-0324-z; 2019; 8 pages.

Wang, W. et al.; "Volatile Resistive Switching Memory Based on Ag Ion Drift/Diffusion Part I: Numerical Modeling"; IEEE Trans. Electron. Devices 66, 3795-3801, doi:10.1109/TED.2019.2928890; 2019; 7 pages.

Wang, Z. et al.; "Memristors with diffusive dynamics as synaptic emulators for neuromorphic computing"; Nature Materials 16, 101-108, doi:10.1038/NMAT4756; 2017; 10 pages.

Wengerowsky, S. et al.; "An entanglement-based wavelength-multiplexed quantum communication network"; Nature 564, 225-+, doi:10.1038/s41586-018-0766-y; 2018; 9 pages.

Wong, H. S. P. et al.; "Metal-Oxide RRAM"; Proceedings of the IEEE 100, 1951-1970, doi:10.1109/JPROC.2012.2190369; 2012; 20 pages.

Yang, J. J. et al.; "High switching endurance in TaOx memristive devices"; Appl. Phys. Lett. 97, doi:10.1063/1.3524521; 2010; 4 pages.

(56) References Cited

OTHER PUBLICATIONS

Yeon, H. et al.; "Alloying conducting channels for reliable neuromorphic computing"; Nat. Nanotechnol. 15, 574-+, doi:10.1038/s41565-020-0694-5; 2020; 12 pages.
Yu, S. M. et al.; "Compact Modeling of Conducting-Bridge Random-Access Memory (CBRAM)"; IEEE Trans. Electron. Devices 58, 1352-1360, doi:10.1109/TED.2011.2116120; 2011; 9 pages.
Yuan, F.-Y. et al.; "Conduction Mechanism and Improved Endurance in HfO2-Based RRAM with Nitridation Treatment"; Nanoscale Research Lett. 12, doi:10.1186/s11671-017-2330-3; 2017; 6 pages.
Zhang, J. et al.; "Advances in InGaAs/InP single-photon detector systems for quantum communication"; Light Sci. Appl. 4, doi:10.1038/lsa.2015.59; 2015; 13 pages.
Zhang, W. et al.; "Neuro-inspired computing chips"; Nat. Electron. 3, 371-382, doi:10.1038/s41928-020-0435-7; 2020; 12 pages.

\* cited by examiner

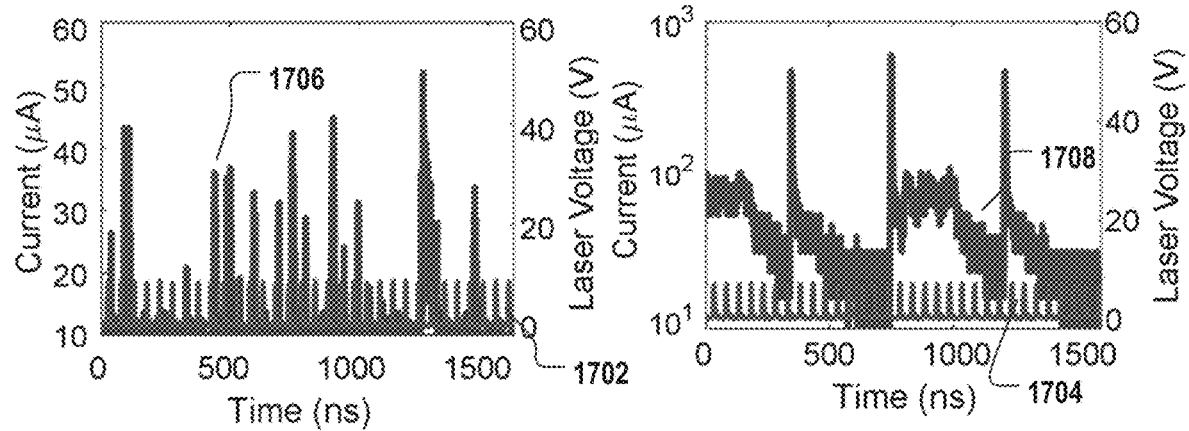
Figure 17a
Figure 17b
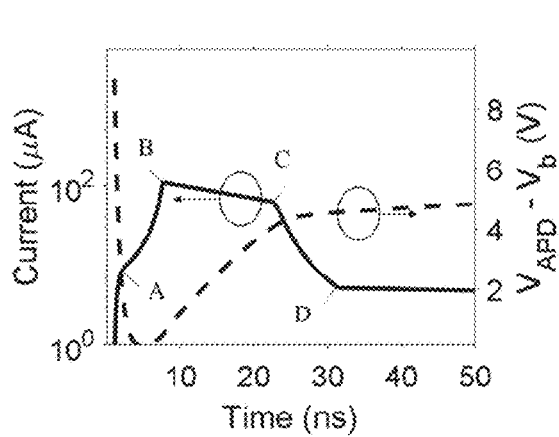
Figure 17c
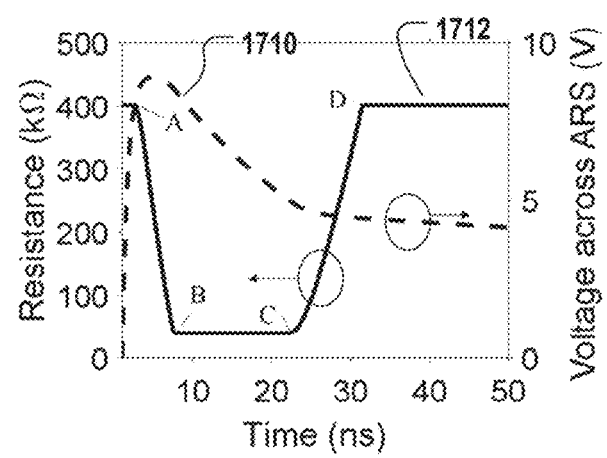
Figure 17d

US 12,336,323 B2

AVALANCHE PHOTODIODES WITH ADAPTIVE QUENCHING OF PHOTOCURRENT

CROSS REFERENCE

This Application is a national phase application of and claims priority to PCT Application Number PCT/US2021/020516, filed on Mar. 2, 2021, which is based on and claims priority to U.S. Provisional Application No. 62/985,095, filed on Mar. 4, 2020, the entireties of which are herein incorporated by reference.

GOVERNMENT LICENSE RIGHTS

This invention was made with government support under ONR Grant No. 5-28336 awarded by the Vannevar Bush Fellowship for GUHA (from Department of Defense, administered by ONR). The government has certain rights in the invention.

BACKGROUND

Avalanche photodiodes (APDs) are highly sensitive semiconductor photodetectors. APDs coupled to a quenching circuitry may be used as a photodetector of single photons by generation of time-resolved photocurrent pulses. The speed in which a photocurrent pulse in such a photodetector is generated and quenched following a single incident photon determines the time resolution of the photodetector for single photon detection. Faster quenching of the photocurrent corresponds to shorter dead-time between consecutive single photon detections by such a photodetector

BRIEF DESCRIPTION OF THE DRAWINGS

The system and method may be better understood with reference to the following drawings and description. Non-limiting and non-exhaustive embodiments are described with reference to these drawings. The components in the drawings are not necessarily to scale, with emphasis instead being placed upon illustrating the general underlying principles of the various disclosed embodiments.

FIG. 17*a* shows avalanche response to a single photon signal with a 20 MHz repetition rate for an APD quenched by an example adaptive quenching resistor.

FIG. 17*b* shows avalanche response to a single photon signal with a 20 MHz repetition rate for an APD quenched by an example fixed quenching resistor.

FIG. 17*c* shows PSPICE simulations of an APD quenched by an adaptive quenching resistor showing variation of avalanche photocurrent (solid curve) and voltage across the APD (dashed curve).

FIG. 17*d* shows PSPICE simulations of an APD quenched by an adaptive quenching resistor showing variation of voltage across the APD and resistance.

DETAILED DESCRIPTION

Figure 1:
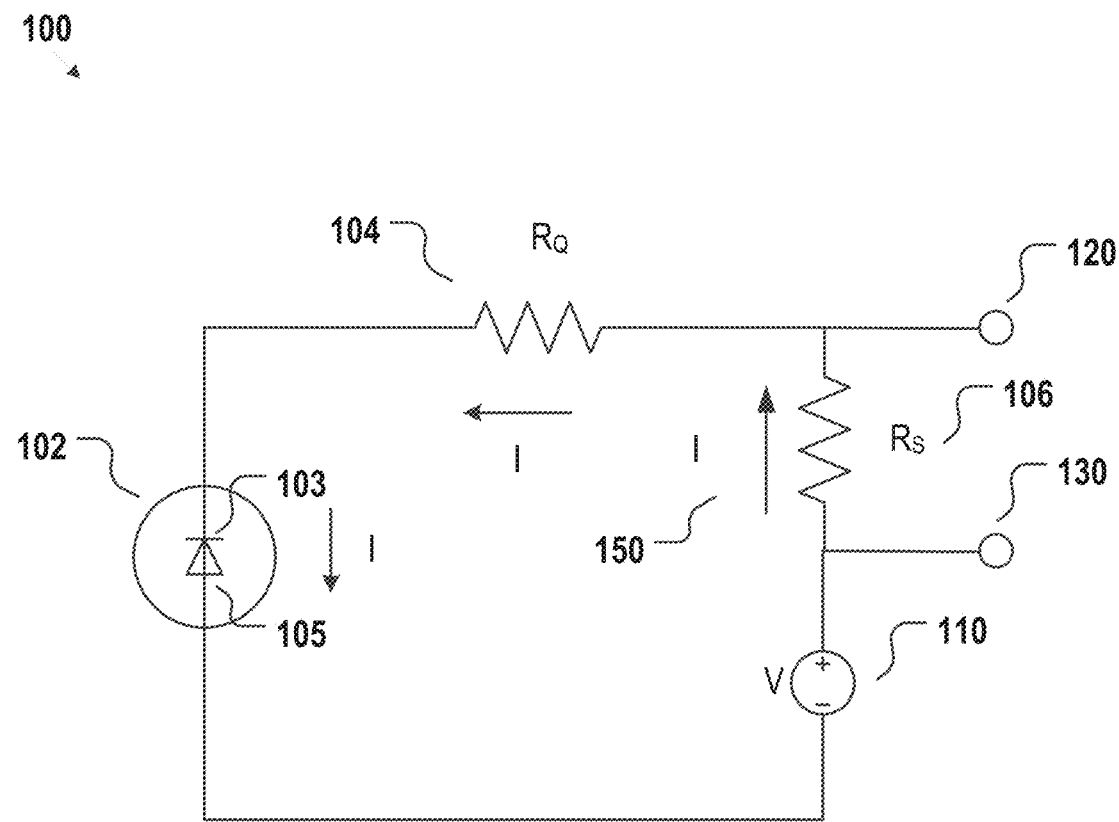
FIG. 1 illustrates an example implementation of a photodetector including an avalanche photodiode (APD) coupled to a fixed quenching resistor and under a reverse electric bias.

A semiconductor diode may include a p-n structure, a p-i-n structure or a Schottky barrier, and may be configured for light detection. Such a semiconductor diode may be referred to as a photodiode. A photodiode may be based on various doped or intrinsic semiconductor materials including but not limited to silicon, germanium, and compound semiconductors such as group III-V compounds (e.g., gallium arsenide/aluminum gallium arsenide, indium phosphide, indium gallium phosphide) and group II-VI compounds (e.g., cadmium selenide). These semiconductor materials may have a direct or indirect bandgap of various energies. Correspondingly, photodiodes based on these materials may be constructed to detect light at various optical spectral ranges, including but not limited to far-infrared, near-infrared, and visible regions of the electromagnetic spectrum. A photodiode may absorb incident light and convert the absorbed light into a photocurrent that flows across the diode structure. Such photocurrent may be sensed using other auxiliary circuitry in addition to the photodiode.

A photodiode may be reversed biased when in operation. Specifically, the n doped side (cathode) of the p-n or p-i-n structure or Schottky barrier (hereinafter collectively referred to as a p-n junction for simplicity) may be biased at a higher voltage than the p doped side (anode). The p-n junction(s) within the photodiode may be characterized by a threshold reverse breakdown bias voltage, denoted by $V_{BR}$. When the photodiode is reverse biased with a reverse bias voltage of magnitude smaller than $V_{BR}$, there will be no avalanche gain or small avalanche gain (linear mode) and the detector is not capable of detecting single photons because the signal to noise ratio may be too small.

Single Photon Avalanche Photodiode

When the photodiode is reversed biased with a bias voltage of magnitude greater than $V_{BR}$, both photo-generated electrons and holes could trigger impact ionizations to form an avalanche and since they drift towards opposite directions, the avalanche forms a positive feedback chain and could not stop by itself. Thereafter, there will be a very high avalanche multiplication gain. In such a condition, the APD operates in Geiger mode and a single photon could be detected. However, since the avalanche does not stop after detecting one photon, the photocurrent sustains. To address this issue, quenching circuits may be used. For Example, a positive quenching circuit may be included with the APD, wherein a gated bias pulse is sent to the APD to trigger and quench the breakdown. By using this method, high speed single photon detection can be realized. However, active quenching circuits are complex and expensive.

Alternatively, a passive quenching circuit could be included with the APD. A passive quenching circuit is simpler and more cost effective than an active quenching circuit. In a passive quenching circuit, for example, a quenching resistor of a fixed resistance value may be placed in series with the APD. When a photon is received at the APD, an avalanche photo-current through the APD is generated. The current in the circuit increases. The resistance of the quenching resistor remains the same and the bias drop across the quenching resistor increases with the current. As such, the bias drop across the APD decreases and the avalanche process may be quenched if the bias drop across the APD decreases to a level that is not enough to sustain a continuous breakdown (e.g., a level at or below the threshold reverse breakdown bias voltage $V_{BR}$ of the APD). After the avalanche is quenched, the current through the APD decreases to nearly zero, the bias drop across the quenching resistor decreases to zero, and the bias across APD increases beyond the threshold reverse breakdown bias voltage $V_{BR}$. The APD thus enters a standby mode ready to detect a next photon. By using passive quenching, the APD maintains high multiplication gain when detecting single photons and can be used for continuously detecting a series of photons. An APD operating in a quenching mode capable of detecting single photons is often referred as single photon avalanche detector (SPAD). Compared to other high-sensitivity photodetectors, such as photomultiplier tubes and superconducting optical detectors, SPADs are compact in size and can operate at room temperature without cooling. While the term SPAD is used to refer to an APD in combination with a quenching circuitry for achieving single photon detection, to simplify this disclosure, the term SPAD is interchangeably used below to also refer to an APD used as part of a single photon detector (e.g., not including the quenching circuitry).

In SPAD, a time period between photocurrent pulse generating and quenching is referred as a dead time of the SPAD. Other photons incident into the SPAD when a photocurrent pulse is being generated (i.e., during the dead time) may not be recognized or resolved by the SPAD. As such, the dead time dominates the response speed of an SPAD. When a positive quenching circuit is used, single photon detection speed is mainly determined by the width of the gated pulse and can reach sub 1 ns level. When a passive quenching circuit is used, single photon detection speed is determined by the resistance value of the quenching resistor. There may be a tradeoff in selecting quenching resistance. In particular, when the resistance value is too small, the SPAD may not be quenched and when the resistance value is too large, the R-C time constant indicative of the length of the dead time of the SPAD may be very large. Typically, using conventional passive quenching circuits with constant-resistance quenching resistors, the dead time may reach tens of nanoseconds when the quenching resistance is sufficiently large to enable quenching. The disclosure below provides a passive quenching mechanism by using a spontaneously adaptable quenching resistor for the passive quenching circuit to simultaneously enable quenching and to provide short dead time.

FIG. 1 illustrates an example photodetector 100 using a passive quenching circuit having a constant-resistance quenching resistor. As shown in the example implementation of FIG. 1, the photodetector 100 includes an SPAD 102, a quenching circuitry 104, a sensing circuitry 106, and a DC voltage source 110, electrically connected in series. The SPAD 102 includes a cathode 103 and an anode 105. The quenching circuitry 104, for example, includes a passive quenching resistor $R_Q$ coupled to the cathode 103 of the SPAD 102. The voltage source 110 may be configured at a constant voltage level to provide reverse bias to the SPAD 102. The sensing circuitry 106 may include a current sensing resistor $R_S$ for sensing electrical current 150 flowing through the series of the SPAD 102, the quenching resistor $R_Q$, and the voltage source 110. The current 150 may be monitored via electrical ports (or terminals) 120 and 130. The sensing resistor $R_S$ may be sufficiently small such that a current monitoring circuitry attached via ports 120 and 130 minimally perturbs the operation of the photodetector 100. As such, the photodetector 100 may be configured as a two-terminal device with ports 120 and port 130 for connection to a current measurement instrument. Other configurations of the sensing circuit are contemplated. In some implementations, the voltage source 110 may be arranged as an externally connectable component to the photodetector 100 rather than being internally included in the photodetector 100. Further, the photodetector 100 may be configured with additional ports or terminals for supplying the reverse bias voltage.

Figure 2:
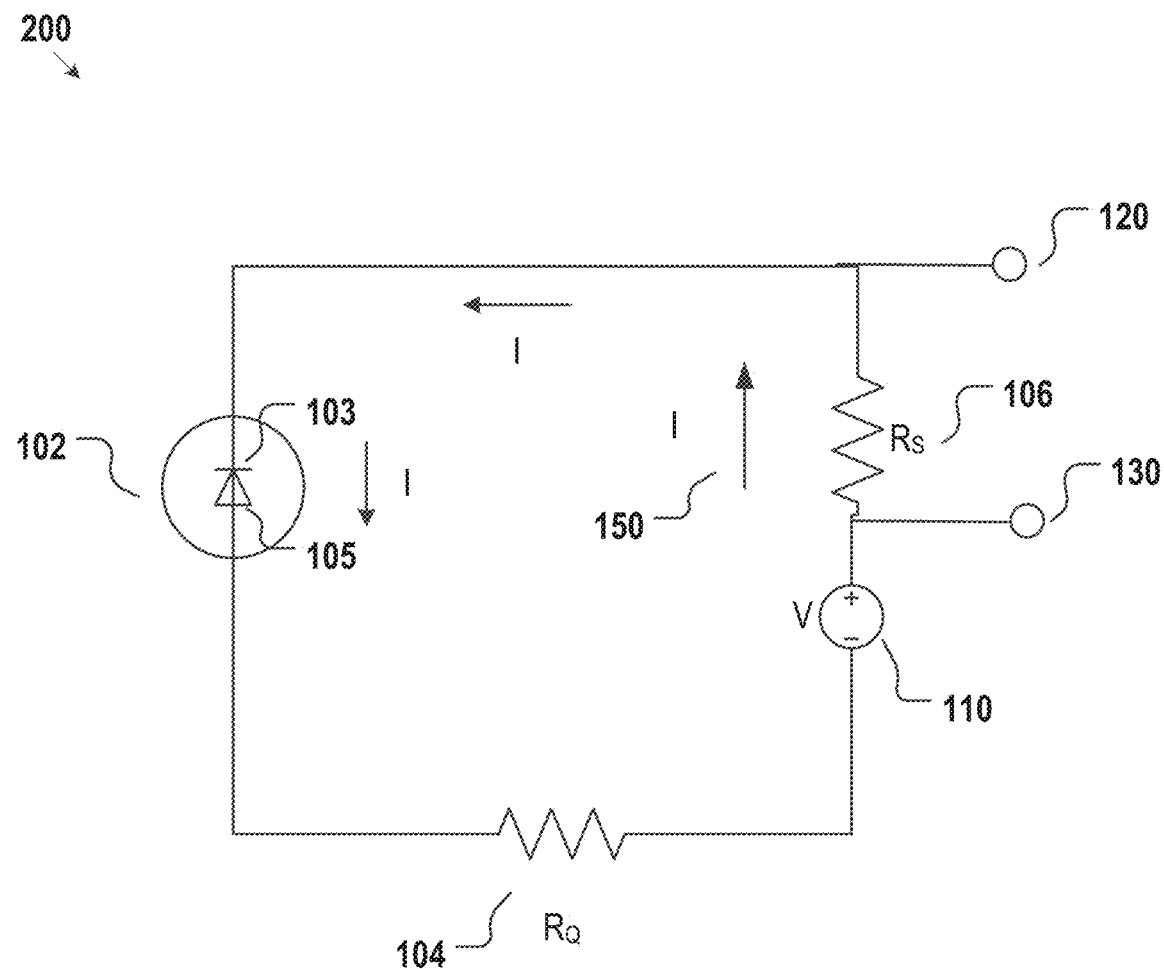
FIG. 2 illustrates another example implementation of a photodetector including an avalanche photodiode (APD) coupled to a fixed quenching resistor and under a reverse electric bias.

FIG. 2 shows another example implementation of a photodetector 200. The photodetector 200 is similar to photodetector 100 of FIG. 1 except that the quenching resistor $R_Q$ is placed in serial between anode 105 of the SPAD 102 and the voltage source 110.

While the sense resistor $R_S$ is used for sensing the current in the photodetectors 100 and 200 above, other current or voltage sensing mechanism may be employed. The underlying principles of the operation of the photodetectors described below are applicable to other photodetectors employing other types of sensing circuitry.

Figure 3:
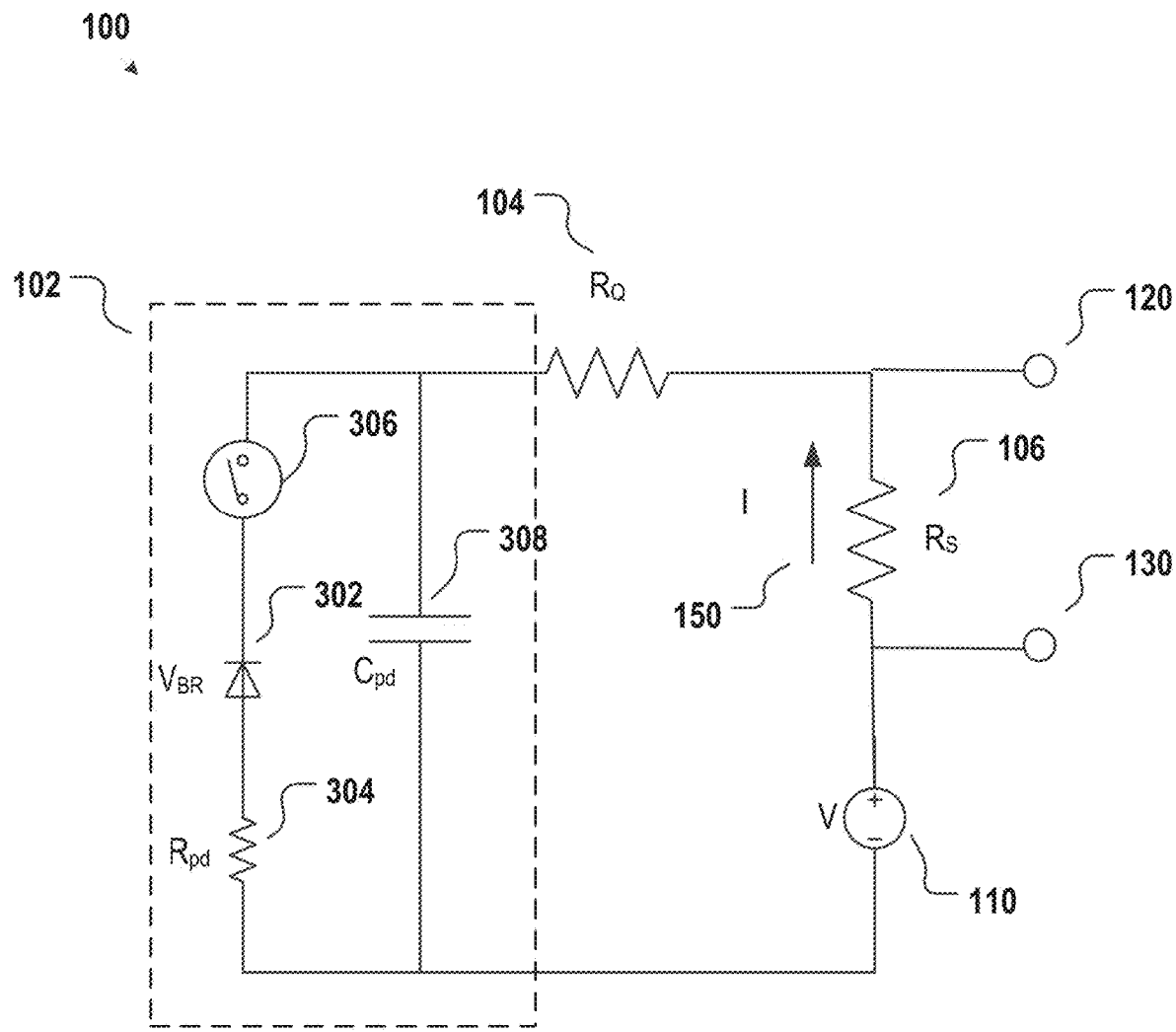
FIG. 3 illustrates an example equivalent circuit of the APD of FIG. 1 coupled to the quenching resistor to form a photodetector.

FIG. 3 illustrates an equivalent circuit for the SPAD 102 in the photodetector 100 of FIG. 1 (the same equivalent circuit applies to the SPAD 102 of the photodetector 200 of FIG. 2 as well. For simplicity, equivalent circuit of FIG. 2 is not shown). In particular, the SPAD 102 may be considered as including a diode 302 having a threshold reverse breakdown voltage $V_{BR}$, an internal resistance $R_{pd}$ 304, and a switch 306 connected in series which is connected with a capacitor $C_{pd}$ 308 representing a photodetector junction capacitance of the SPAD 102. The switch 306 represents whether avalanche current is on or off in the diode 302.

Figure 4:
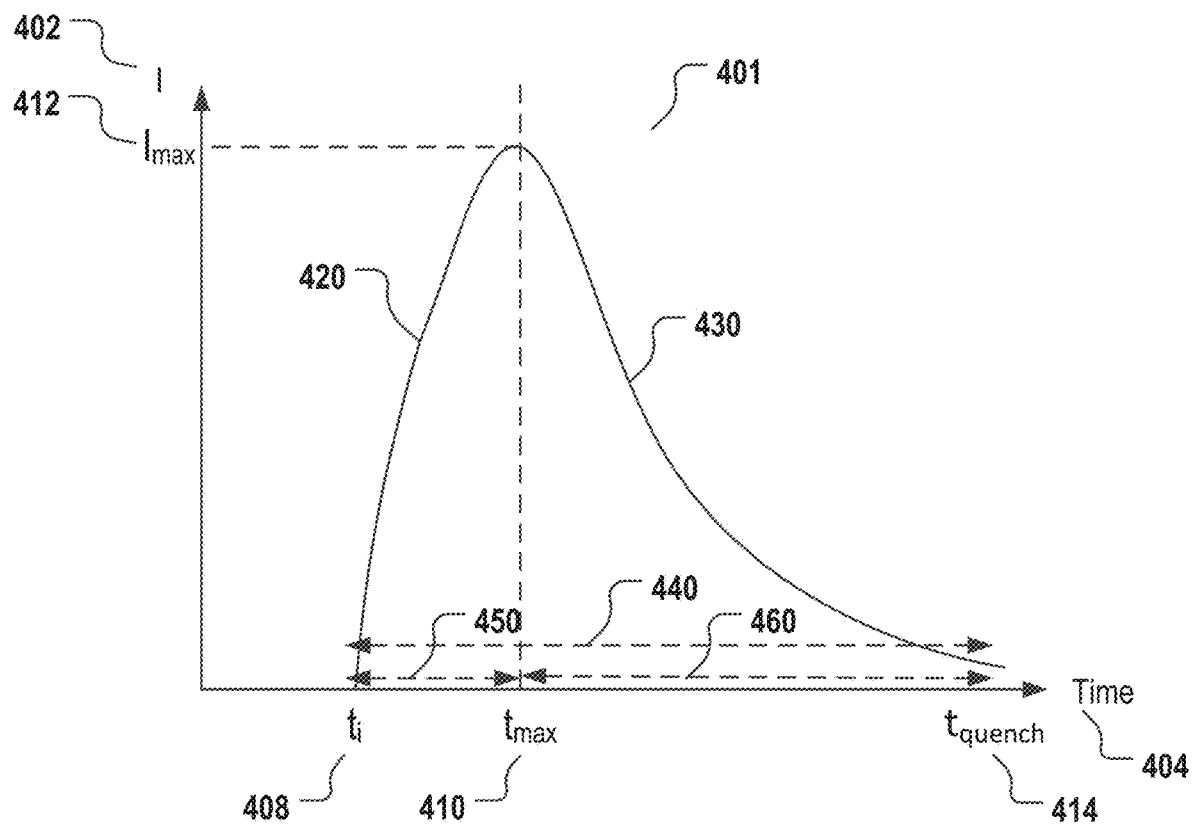
FIG. 4 illustrates, in a general manner, dynamics of photocurrent rising and quenching in the photodetector of FIGS. 1 and 3 after the photodetector is illuminated with a single photon.

The principles of operation for the photodetector 100 of FIG. 3 for single photon detection are explained in more detail below and are illustrated in FIG. 4 (the principles of operation of the photodetector 200 of FIG. 2 are similar. For simplicity, description of the operation principles of the photodetector 200 is omitted below). Specifically, FIG. 4 shows an example time evolution curve 401 of the current 150 flowing through the SPAD 102, the quenching resistor $R_Q$ 104, the sensing resistor $R_S$ 106, and the voltage source 110 of FIG. 3 before and after an incidence of a single photon at time $t_i$ 408. In FIG. 4, the y axis 402 represents current 150 whereas the x axis 404 represents time. The voltage source 110 provides a constant bias voltage V that is set above the threshold reverse breakdown bias voltage $V_{BR}$ of the SPAD 102.

As shown in FIG. 4, there is no current in the photodetector 100 prior to the incidence of the single photon (time $t_i$ 408). During this time period prior to $t_i$, the switch 306 is open (indicating that there is no light incident on the SPAD 102 yet) and the voltage V of the voltage source 110 drops fully across the charged photodetector junction capacitor $C_{pd}$ 308 of the SPAD 102. The voltage drop across the quenching resistor 104 is zero. The current flowing across the sensing resistor $R_S$ 106 is zero, as can be monitored via ports 120 and 130.

At time $t_i$ 408, one or more photons are incident on the SPAD 102, closing the switch 306. As a result, the p-n junction of the SPAD 102 is then instantaneously reverse biased at V by the fully charged photodetector junction capacitor $C_{pd}$ 308 and the voltage source 110. Because the bias voltage V is above the threshold reverse breakdown bias voltage $V_{BR}$ of the SPAD 102, the diode 302 of the APD begins to operate in Geiger mode. A photo carrier avalanche occurs via impact ionization in the p-n junction of the SPAD 102. The photodetector junction capacitor $C_{pd}$ 308 thus instantly begins to discharge to supply current to the diode 302, resulting in a voltage drop on the photodetector junction capacitor $C_{pd}$ 308. In the meanwhile, the voltage source 110 begins to provide current that flows through the quenching resistor $R_Q$ 104 to create a voltage drop that compensates the voltage decrease across the photodetector junction capacitor $C_{pd}$ 308 (such that the total voltage across the photodetector junction capacitor $C_{pd}$ 308 and the quenching resistor $R_Q$ 104 is V). As such, the current 150 rises from zero, as monitored by the sensing resistor $R_S$ and shown by the rising portion 420 of the current curve 401 in FIG. 4. In other words, in correspondence to a voltage drop across the photodetector junction capacitor $C_{pd}$ 308 due to discharging, current 150 rises, leading to a rising voltage across the quenching resistor $R_Q$ 104 tracking the voltage drop of the photodetector junction capacitor $C_{pd}$ 308.

In some implementations, the quenching resistor $R_Q$ 104 may be configured to be significantly larger than the internal resistor $R_{pd}$ 304 of the SPAD 102. As described later in this disclosure, when the quenching resistor $R_Q$ 104 is too small, the photocurrent may be sustained rather than quenched after a single photon is detected. For example, the internal resistor $R_{pd}$ of the SPAD 102 may be on the orders of tens or hundreds of ohms whereas the quenching resistor may be on the order of hundreds of thousands of ohms to Giga ohms.

Because $R_{pd}$ is small, the photodetector junction capacitor $C_{pd}$ 308 would initially discharge quickly with a time constant $R_{pd}C_{pd}$ through the SPAD 102. Correspondingly, the current 150 from the voltage source 110 and voltage drop across the quenching resistor $R_Q$ rises to track the voltage drop of the photodetector junction capacitor $C_{pd}$ 308. The rise of the current, for example, may be given by:

$$I \sim (V - V_{BR})(1 - \exp(-t/R_{pd}C_{pd}))R_Q, \qquad (1)$$

as shown in the rising portion 420 of the current curve 401 in FIG. 4. The rising current 150 from the voltage source may be supplied to the diode 302. Correspondingly, the voltage across the SPAD 102 drops as a function of time:

$$V_{pd} \sim (V - V_{BR})\exp(-t/R_{pd}C_{pd})) + V_{BR} \qquad (2)$$

The photodetector junction capacitor $C_{pd}$ 308 discharges until its voltage falls from V to the threshold $V_{BR}$, at which time the photo avalanche process ceases and the switch 306 opens. The time it takes for discharging the $C_{pd}$ 308 to $V_{BR}$ is determined by $V_{pd} \sim V\exp(-t/R_{pd}C_{pd})$ as $t_{discharge} \sim R_{pd}C_{pd} \ln(V/V_{BR})$. At the time of the cease of the avalanche process, the current 150 reaches a maximum of $I_{max} \sim (V - V_{BR})/R_Q$, corresponding to a $t_{max} \sim t_i + t_{discharge} = t_i + R_{pd}C_{pd} \ln(V/V_{BR})$, as shown by 412 and 410 in FIG. 4. Because the constant reverse bias voltage V of the voltage source 110 is typically selected to be only slightly above the threshold reverse breakdown bias voltage $V_{BR}$ (e.g., with a V of 22 volt vs. a $V_{BR}$ of 20 volt), the discharge time of the photodetector junction capacitor 308 prior to the cease of the photo carrier avalanche process in the diode 302 is $t_{discharge}$ may be approximated as $R_{pd}C_{pd}$. Correspondingly, $t_{max}$ may be approximated by $t_{max} \sim t_i + R_{pd}C_{pd}$. The discharge time $t_{discharge}$ may be impacted (prolonged) slightly due to the charging of the photodetector junction capacitor 308 by the voltage source 110. This impact, however, may be ignored since most of the rising current 150 prior to the cease of the avalanche process is supplied to the diode 302 rather than the photodetector junction capacitor 308.

After the cease of the avalanche process, because the switch 306 is open, the voltage source 110 now only continues to charge the photodetector junction capacitor 308 with a charging current that falls from the a maximum current 150 of $I_{max} \sim (V - V_{BR})/R_Q$, as shown by the falling portion 430 of the current curve 401 in FIG. 4. As estimated above, the time $t_{max}$ for the current 150 to reach the maximum of $I_{max} \sim (V - V_{BR})/R_Q$ is roughly determined as $t_{max} \sim t_i + R_{pd}C_{pd} \ln(V/V_{BR}) \sim R_{pd}C_{pd}$.

The current 150 falls at a time constant determined by $R_Q C_{pd}$ after $t_{max}$ as the photodetector junction capacitor 308 is being charged The charging current supplied to the SPAD and the voltage rise across the SPAD respectively follows:

$$I \sim (V - V_{BR})\exp(-t/R_Q C_{pd}))R_Q, \qquad (3)$$

$$V_{pd} \sim -(V - V_{BR})\exp(-t/R_Q C_{pd})) + V \qquad (4)$$

Because $R_Q$ is relatively large, the falling portion of the current 150 as indicated by 430 of FIG. 4 may be relatively slow. The time at which the photodetector junction capacitor is fully charged back to V is referred to as $t_{quench}$, as indicated by 414 of FIG. 4. Based on the description above, $t_{quench}$ may roughly be determined by $t_{quench} \sim t_{max} + R_Q C_{pd}$. The exact definition of $t_{quench}$ may vary. For example, $t_{quench}$ may be defined as the time point when the photodetector junction capacitor $C_{pd}$ 308 is charged to $1-1/e$ of the total bias voltage V (e being the natural number). Any other definitions may be used.

The time period of $t_{quench} - t_i$ as indicated by 440 in FIG. 4 essentially determines a pulse duration of the current 150 flowing through the sense resistor $R_S$ and as monitored via ports 120 and 130, including current rising time period $t_{max} - t_i$ 450 and the current falling period $t_{quench} - t_{max}$ 460. The rising time period 450 may be relatively short as a result of a small $R_p d$ 304, whereas the falling time period 460 may be relatively long due to a large quenching resistor $R_Q$ 104 (again, as shown further below, the quenching resistor $R_Q$ 104 need to be sufficiently large compared to the internal resistor $R_{pd}$ 304 in order to effectively quench the photocurrent generated by the single incident photon). While the photocurrent flowing through the p-n junction of the SPAD 102 only last during the rise time period 450 of length $t_{max} - t_i$, (at end of which the switch 306 opens and the avalanche process in the p-n junction ceases), shorter than the pulse length of current 150 monitored at by the sensing resistor $R_S$ 106 of $t_{quench} - t_i$, the current 150 may still be referred to as a photocurrent of the photodetector 100, and the current pulse 401 of FIG. 4 may be referred to as a photocurrent pulse of the photodetector 100.

The duration of the photocurrent pulse 401 induced by the incidence of the single photon represent a dead time, denote by $t_{dead}$. During this period of time, no resolvable photocurrent pulses may be generated by any other incident photons. After the dead time $t_{dead}$, the photo detector 100 is ready to resolve and detect another photocurrent pulse.

Figure 5:
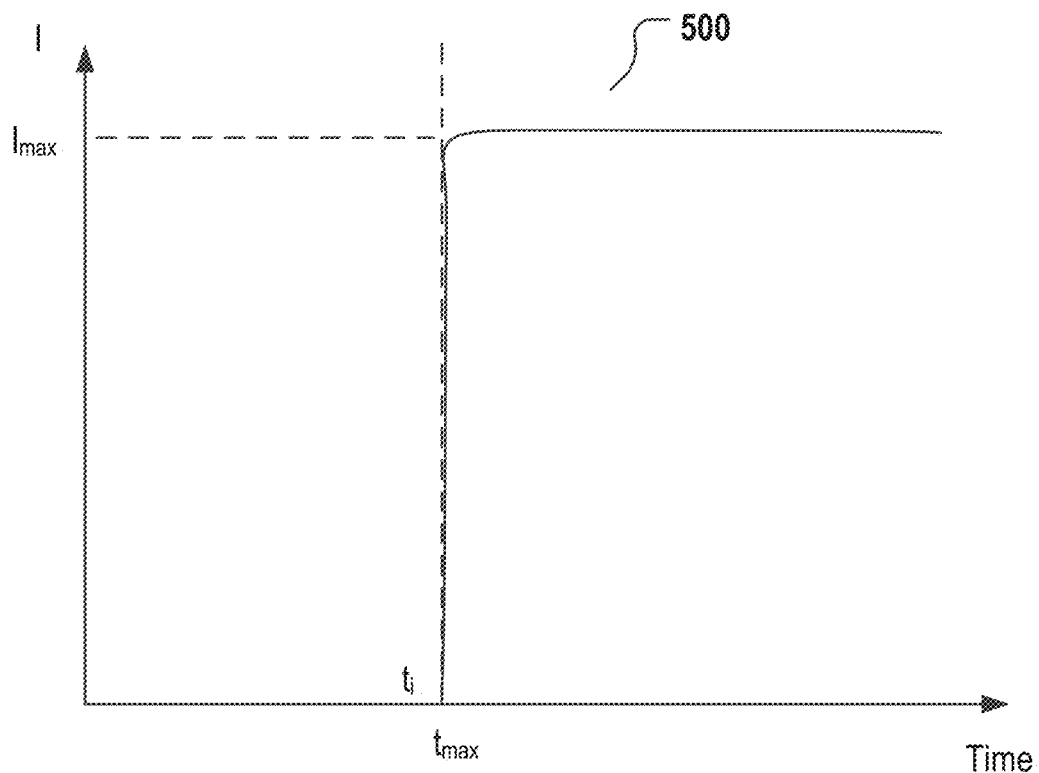
FIG. 5 illustrates example dynamics of photocurrent rising and quenching in the photodetector of FIGS. 1 and 3 after the photodetector is illuminated with a single photon.
Figure 6:
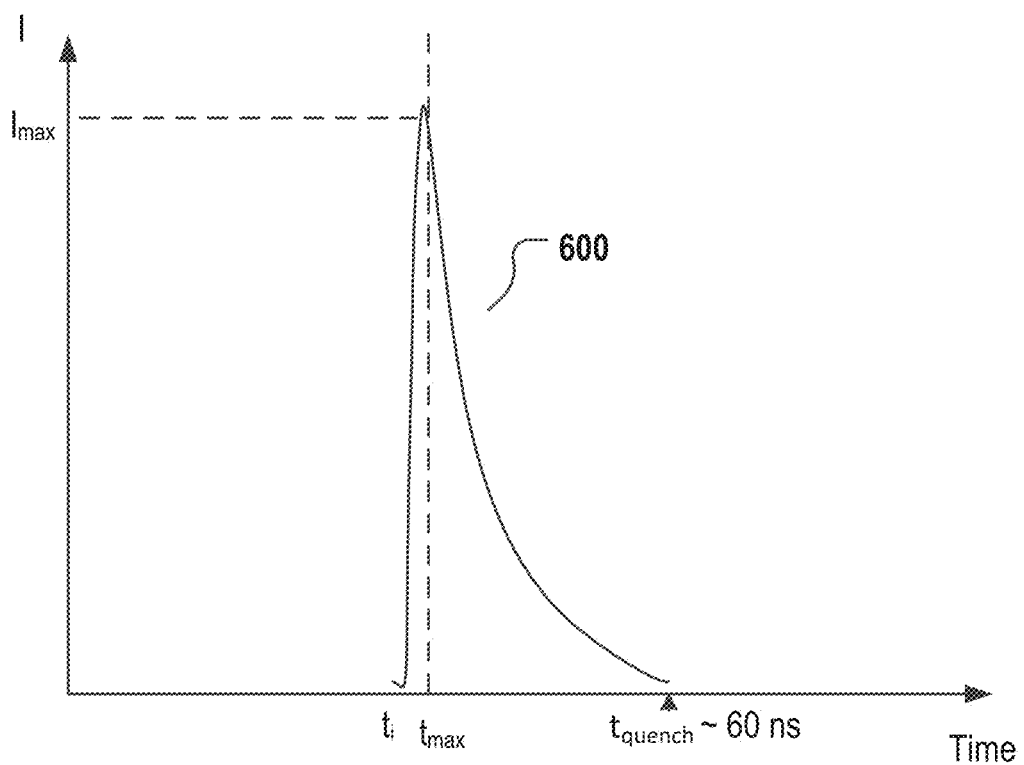
FIG. 6 illustrates another example of the dynamics of photocurrent rising and quenching in the photodetector of FIGS. 1 and 3 after the photodetector is illuminated with a single photon.
Figure 7:
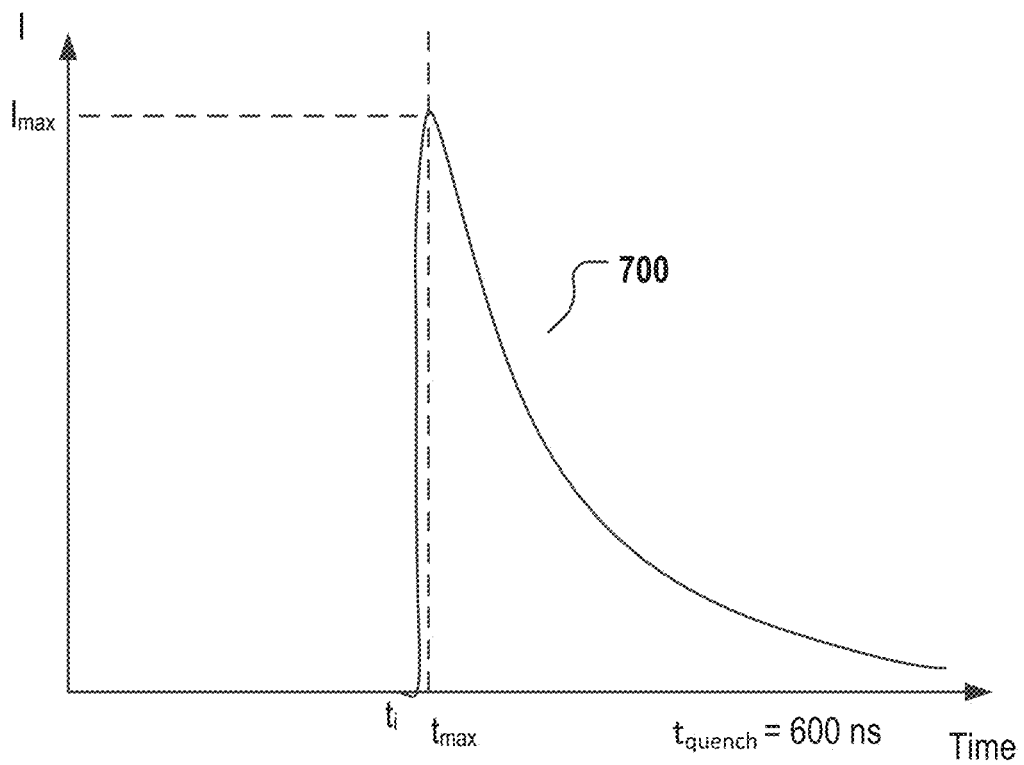
FIG. 7 illustrates yet another example of the dynamics of photocurrent in the photodetector of FIGS. 1 and 3 after the photodetector is illuminated with a single photon.

FIGS. 5-7 illustrate simulated or calculated photocurrent dynamics triggered by a single photon for photodetector 100 have various example $R_{pd}$ 304, $C_{pd}$ 308, and $R_Q$ 104. In the example of FIG. 5, the $R_{pd}$ 304 is assumed to be 100Ω, $C_{pd}$ 308 is assumed to be 100 fF, and $R_Q$ 104 is assumed to be 1 KΩ. Further, the threshold reverse breakdown bias voltage $V_{BR}$ is set at 20 volts whereas the voltage source 110 is set of 22 volts. As shown by the current curve 500 in FIG. 5, the photocurrent generated by the single photon incident at time $t_i$ sustains after $t_i$, indicating that the quenching resistor $R_Q$ 104 is not sufficiently large to quench the photocurrent. This is because when $R_Q$ 104 is relatively small compared to $R_{pd}$ 304, as the photodetector junction capacitor 308 discharges via the diode 302 after the incidence of the single photon, the voltage source 110 simultaneously charge the capacitor 308 sufficient fast that the voltage across the photodetector junction capacitor 308 may not dip below the threshold reverse breakdown bias voltage $V_{BR}$ of the diode 302. As such, the avalanche process continues and the photocurrent may not cease, with the continuous current fed by the voltage source 110.

FIGS. 6-7 show that when the quenching resistor $R_Q$ 104 is sufficiently large, the photocurrent generated by the single incident photons may be quenched. For example, in FIG. 6, the $R_{pd}$ 304 is assumed to be 100Ω and $C_{pd}$ 308 is assumed to be 100 fF, the same as the example of FIG. 5. However, the $R_Q$ is assumed to be 100 KΩ in FIG. 6. As shown by the current curve 600 in FIG. 6, the photocurrent is quenched and the fall time of the current 150 monitored across the sensing resistor $R_S$ 106 (which dominates the photocurrent pulse 600) is about tens of ns. Further in the example of FIG. 7, the $R_p d$ 304 is also assumed to be 100Ω and $C_{pd}$ 308 is assumed to be 100 fF, the same as the example of FIGS. 5 and 6. However, the $R_Q$ 104 is assumed to be 1 GΩ in FIG. 7. As shown by the current curve 700 in FIG. 7, the photocurrent is quenched and the fall time of the current 150 monitored across the sensing resistor $R_S$ 106 (which dominates the photocurrent pulse 700) is about hundreds of ns.

For many single-photon applications discussed in the disclosure above, a high time resolution (small dead time $t_{dead}$) for the detector 100 may be desired. As shown above in FIGS. 5-7, the quenching resistor $R_Q$ 104 needs to be sufficiently large in order to quench the photocurrent (e.g., $R_Q$ 104 of 1 KΩ would not be sufficient to quench the photocurrent in the example above). In the meanwhile, to achieve a short dead time $t_{dead}$ and high time resolution around 1 ns for single photon detection, the $R_Q$ 104 would need to be at 1 KΩ or smaller. As such, there is a contradiction or tradeoff in selecting the quenching resistor $R_Q$ 104. Higher $R_Q$ gives rise to quenching but provides slower fall time, lower $R_Q$ provides a fast fall time but the photodetector may not be quenched. As shown in the parameters used in FIGS. 6-7, $R_Q$ 104 may be generally 1000 times larger than $R_{pd}$ 304. While the fall time may be improved by decreasing $C_{pd}$, (while maintaining large enough $R_Q$ 104), such an approach would need reduction of active area in the APD, leading to undesired reduction in detection sensitivity.

SPAD with Adaptive Quenching Resistor

In some implementations disclosed below, the quenching resistor may be implemented as an adaptive quenching resistor that is engineered to spontaneously, adaptively, and dynamically provide sufficient quenching resistance and at the same time improved time resolution for single photon detection without having to decrease the active area of the SPAD. In particularly, a nonlinear resistor (as a function of voltage applied across the resistor) may be used as the quenching resistor $R_Q$ 104 such that it maintains a high resistance $R_{Qhigh}$ at low voltages but self-transitions to a low resistance state $R_{Qlow}$ above a transition voltage $V_{t1}$. Such an adaptive quenching resistor $R_Q$ 104 thus maintains a high resistance before the incidence of a single photon (because the voltage across the quenching resistor $R_Q$ 104 during this time period is zero, as described above) and during the current rise time period of e.g., 450 of FIG. 4, such that the discharging of the photodetector junction capacitor $C_{pd}$ 308 (with a time scale determined by $R_{pd}$ 304) is much faster than the charging by the voltage source (with a time scale determined by $R_{Qhigh}$ 104) and that the photodetector junction capacitor $C_{pd}$ 308 can be quickly discharged below the threshold reverse breakdown bias voltage $V_{BR}$ of the diode 302 to induce quenching of the avalanche process. Following the quenching of avalanche, when the voltage across $R_Q$ 104 may be above the transition voltage $V_{t1}$ and the quenching resistor $R_Q$ 104 may adaptively reduce its resistance to a low value $R_{Qlow}$. Subsequently, the photodetector junction capacitor $C_{pd}$ 308 may be quickly charged at a time scale according the low resistance value $R_{Qlow}$ of the quenching resistor $R_Q$ 104.

The resistance of the adaptive quenching resistor $R_Q$ 104 may be implemented as reversible to its high resistance value $R_{Qhigh}$. As such, once the photodetector junction capacitor $C_{pd}$ is fully charged, the quenching resistor $R_Q$ 104 restores its high resistance value $R_{Qhigh}$ for the next single photon detection event. The dead time $t_{dead}$ of the photodetector 100 for single photon detection is thus reduced due to the adaptive resistance adjustment of the quenching resistor $R_Q$ 104 during the single photon detection process.

Figure 8:
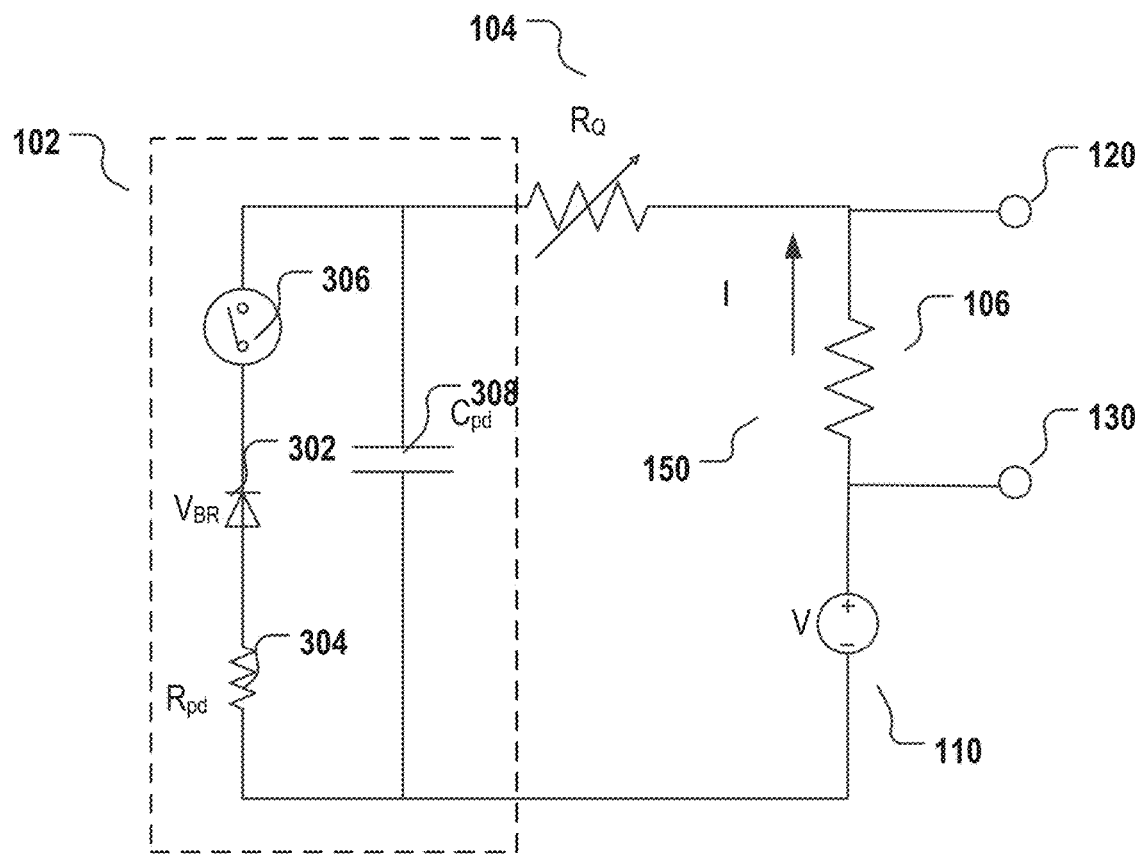
FIG. 8 illustrates an example implementation of a photodetector including an avalanche photodiode coupled to an adaptive quenching resistor and under a reverse electric bias for improving time resolution of the APD for single photon detection.
Figure 9:
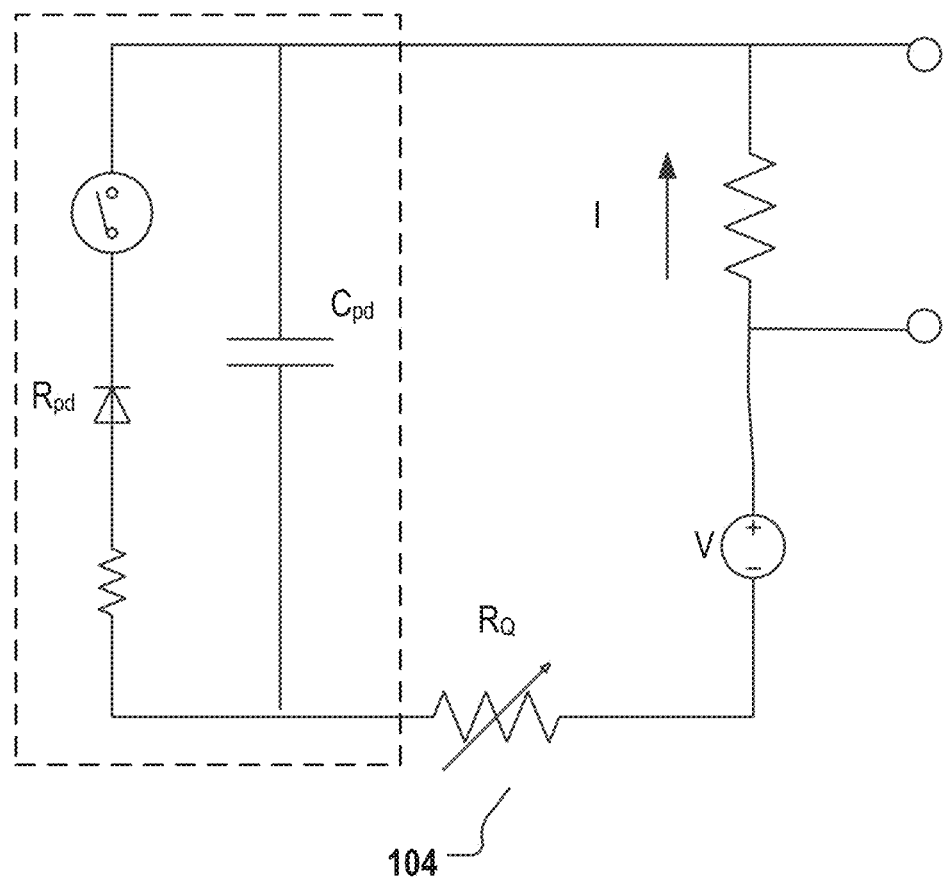
FIG. 9 illustrates another example implementation of a photodetector including an avalanche photodiode coupled to an adaptive quenching resistor and under a reverse electric bias for improving time resolution of the APD for single photon detection.

FIG. 8 illustrates such a photodetector 800 including an adaptive quenching resistor for single photon detection. The implementation of FIG. 8 corresponds to FIGS. 1 and 3 except that the fixed quenching resistor $R_Q$ 104 of FIGS. 1 and 3 is replaced by the adaptive version of the quenching resistor $R_Q$ 104 in FIG. 8. Similarly, FIG. 9 illustrates a photodetector 900 including an adaptive quenching resistor for single photon detection. The implementation of FIG. 9 corresponds to FIG. 2 except that the fixed quenching resistor $R_Q$ 104 of FIG. 2 is replaced by the adaptive version of the quenching resistor $R_Q$ 104 in FIG. 9.

Figure 10:
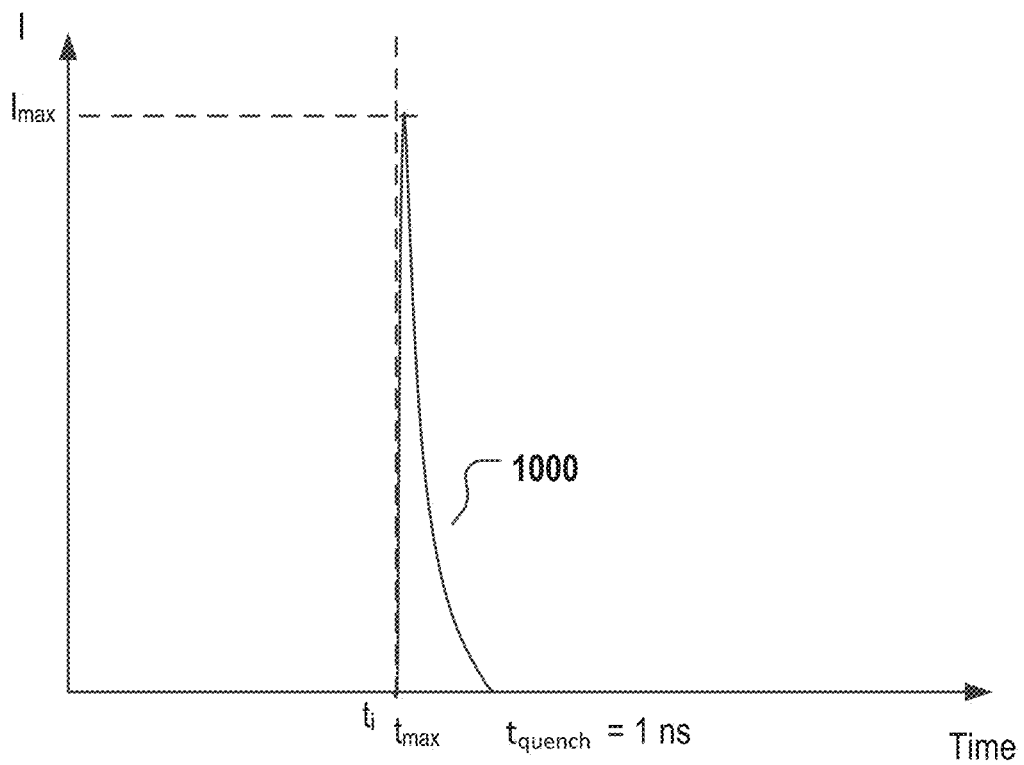
FIG. 10 illustrates example single photon detection in an APD based on an adaptive quenching resistor of FIGS. 8 and 9.

FIG. 10 illustrates an example simulated or calculated photocurrent dynamics curve 1000 for the photodetector 800 or 900 of FIG. 8 or FIG. 9. FIG. 10 shows that because of the adaptive self-adjustment of the resistance of the quenching resistor $R_Q$ 104, the pulse of current 150 generated by the incidence of a single photon may be much shorter compared to that of FIGS. 6-7. In FIG. 10, it is assumed that the internal APD resistance $R_{pd}$ 304 is 100Ω. The adaptive $R_Q$ resistance is assumed to have a high resistance value $R_{Qhigh}$ of 1 GΩ at low voltage across $R_Q$ and a low resistance value $R_{Qlow}$ of 1 KΩ at high voltage across $R_Q$. For example, the photocurrent dynamics curve 1000 of FIG. 10 shows that the dead time for single photon detection may be reduced to several nanosecond or shorter using an adaptive quenching resistor.

Adaptive Quenching Resistor

In some implementations of FIG. 8, the adaptive quenching resistor $R_Q$ 104 may be implemented as an adaptive resistive switch (ARS). For example, the adaptive quenching resistor $R_Q$ 104 may implemented using materials that exhibits a resistivity switching behavior (between a high and low resistance) as a function of applied voltage (or electric field).

In the implementations of FIG. 8 using an ARS as the adaptive quenching resistor $R_Q$ 104, the adaptive quenching resistor $R_Q$ 104 is connected in series with the SPAD (replacing the passive resistor $R_Q$ in FIG. 3). A dynamic interaction between resistance adaptation process and avalanche quenching may enable the SPAD to achieve dramatically reduced dead time. Before and when an absorbed photon triggers an avalanche in the SPAD, the ARS may be in an ARS off-state (high resistance, with low voltage across). The SPAD capacitor discharges following the avalanche, and the avalanche is quenched when $V_{pd}$ falls below $V_{BR}$ as a result of the discharge. Until this point, the ARS resistance of the adaptive quenching resistor $R_Q$ 104 may remain in the high resistance state to enable rapid quenching of the SPAD. Following avalanche termination, the ARS may adaptively and self-switch to a "low" resistance state driven by the voltage built up across it due to the drop in $V_{pd}$. This time scale may be dictated by the ARS mechanism and response dynamics within the adaptive quenching resistor $R_Q$ 104, e.g., as described in more detail below, by the formation of the conductive filament across some example oxide as a function applied voltage due to electric-field-induced metal drift in such an example oxide material. The transition to the low resistance state in the ARS, in turn, enables rapid recharging of the SPAD. As the recharging progresses, the voltage across the ARS decreases, and when the voltage attains a value smaller than an "off" voltage of the ARS, e.g., when the conductive filament dissolves, the ARS returns to its high resistance off-state, and the SPAD circuit is reset. The dynamic lowering of the ARS resistance enables rapid resetting of the SPAD circuit.

In some implementations, the ARS may be implemented using a resistive element with a reversible electric field dependent electrical conduction breakdown in various materials. For example, the adaptive quenching resistor $R_Q$ 104 may be implemented in the form of a dielectric layer that provides the reversible electric field dependent electrical conduction breakdown. Such a field dependent electrical conduction breakdown may be realized as a result of formation of electrical conduction paths within the dielectric layer (that is otherwise highly resistive), when the dielectric layer is biased above a certain threshold transition voltage, the $V_{t1}$ above (which corresponds to a certain threshold transition electric field). Such a conduction path may be filamentary in nature. The dielectric layer is restored to its high resistivity state when the voltage across it is reduced below a transition voltage $V_{t2}$. In some implementations, $V_{t2} \leq V_{t1}$.

For example, this conduction breakdown can occur via the formation of one or more electrically conductive filaments consisting of volumes with high densities of point defects or impurity atoms that short the dielectric under an electric field above the threshold $V_{t1}$. Upon removal of the electric field, the shorting filaments in the dielectrics shrink and the resistance of the dielectric film returns to a high resistive state that is equal to, or close to its original high resistivity value. In the case where impurity atoms constitute these filaments, they may be dispersed within the dielectric film, or may diffuse out of one or more of the electrodes attached to the dielectric layer that is used to apply voltage across the dielectric. In the case of point defects forming the filaments, they may be defects such as vacancies, interstitials or a combination thereof.

Such dielectric layer may be of varied types and forms. For example, it may include oxides such as $Al_2O_3$, $AlO_x$, $HfO_2$, $ZrO_2$, $La_2O_3$, $Y_2O_3$, $SiO_2$, $TiO_2$, TaO, $V_xO_y$ and alloys of these example oxides. These oxides be further alloyed with nitrogen and included in the dielectric layer. For another example, the dielectric layer may include various types of nitrides. The dielectric layer may include organic or polymeric materials that are insulating in their native state. The dielectric layer can be deposited by a variety of techniques, including but not limited to physical vapor deposition, sputtering, chemical vapor deposition, atomic layer deposition, ultra-high vacuum evaporation, and derivatives of these techniques. The films forming the dielectric layer may range between ~1 nm to ~100 nm or between ~1 nm to ~10 nm in thickness. Impurity atoms forming the filaments in the dielectric layer can be fast diffusing metal species including but not limited to Ag, Cu, and/or Sn. Electrodes may be included with the dielectric layer on the top and bottom to form two terminals of the quenching resistor and for applying electric field. For example, Ag or Cu may be used as electrodes and to act as a source of the impurity. Other metallic electrodes including but not limited to Pt, Au, and TiN may be used. For example, a class of these materials consist of dielectric metal oxides such as $HfO_2$ and $Al_2O_3$ placed between an inert electrode (e.g., Pt) and an electrode of a diffusing metal species such as Ag which creates the conducting filament across the $Al_2O_3$ layer by bias dependent metal diffusion. When the bias is removed, the filament dissolves. These materials provide the ARS behavior in the context of their use as dynamic quenching elements for SPADs. Such filamentary devices can achieve a large resistance ratio of $10^7$-$10^{10}$ between their high and low resistance states under I-V measurement.

Example ARS Fabrication Process

Figure 12A:
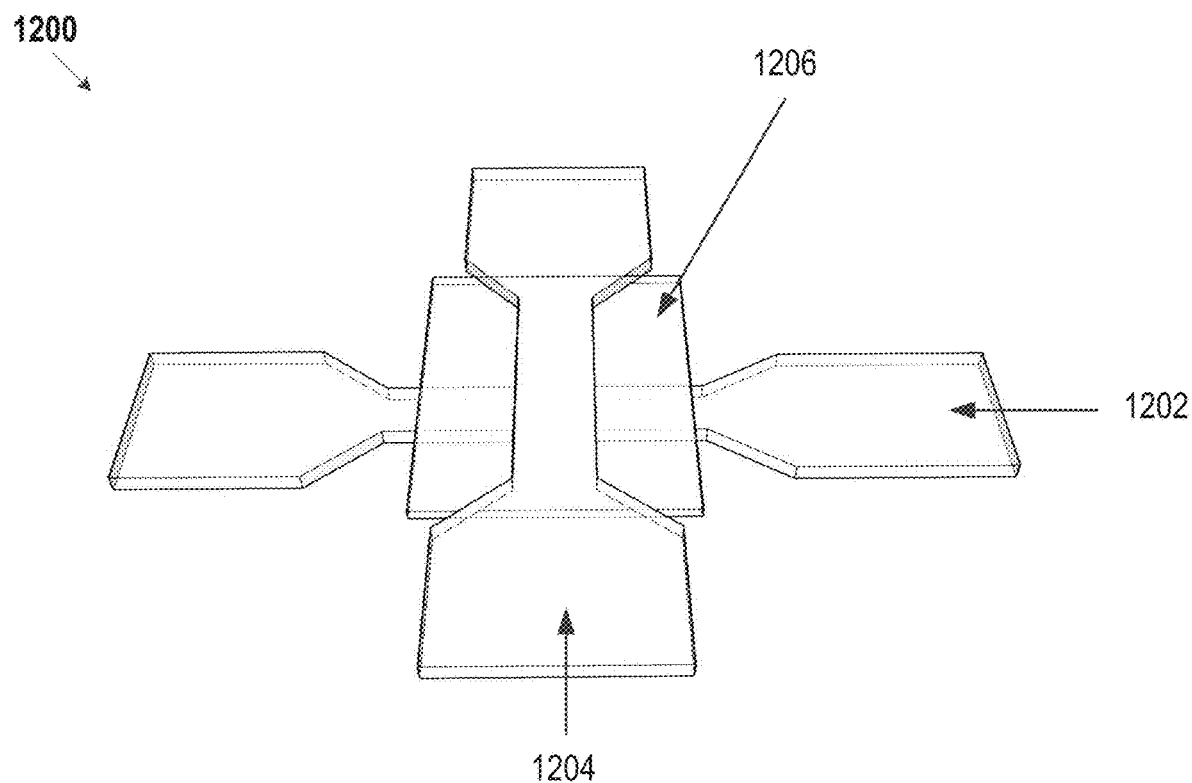
FIGS. 12*a* and 12*b* show example adaptive quenching resistor structures based on conduction breakdown in a dielectric layer.
Figure 12B:
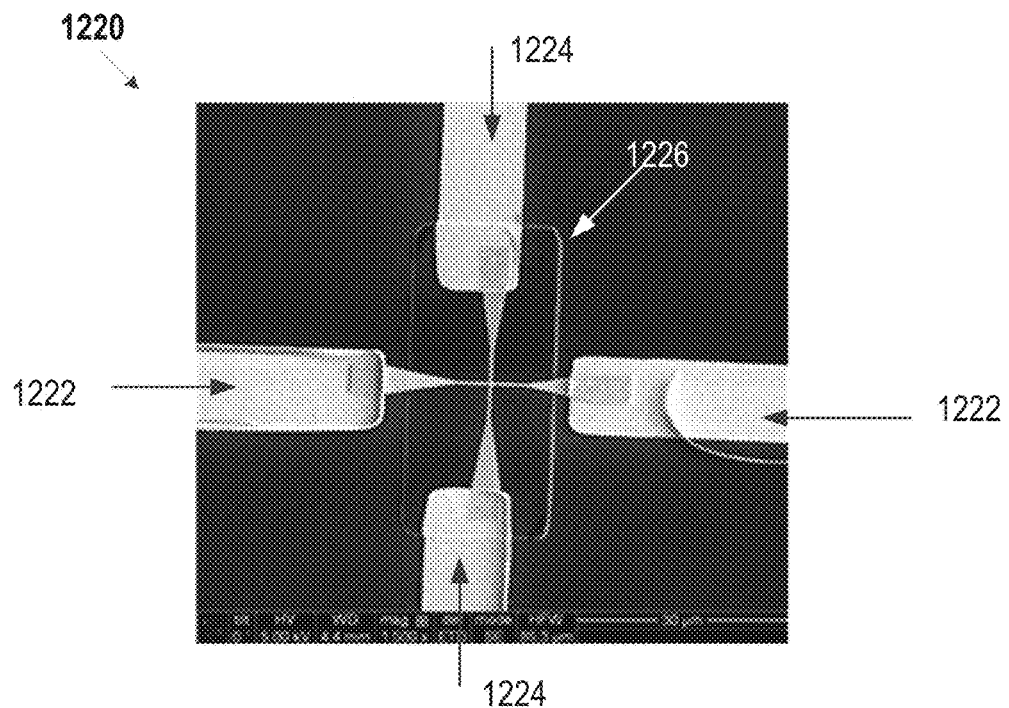

Merely as one of many examples, an ARS device may be fabricated on Si wafers covered with thermal $SiO_2$ (e.g., 100-500 nm, or other thickness), as shown in the example ARS devices in FIGS. 12a and 12b. As shown in FIGS. 12a and 12b, a cross-bar geometry may be used. For example, the ARS devices 1200 and 1220 may include bottom electrodes 1202 and 1222, and top electrodes 1204 and 1244. The electrodes may be of any suitable width (e.g., 100-1000 nm) and may, for example be fabricated using electron-beam lithography followed by electron-beam evaporation of, for example, Ti/Pt or other bilayer thin film structure (e.g., 5 nm of Ti and 50 nm of Pt, or other thicknesses) and a lift-off process. An $AlO_x$ layer 1206 and 1226 may be deposited by, for example, atomic layer deposition at a suitable substrate temperature (e.g., 100-300° C.), using for example, precursors such as trimethylaluminium (TMA) and $H_2O$. The $AlO_x$ layer 1226 may be then patterned via, for example, photolithography and reactive ion etching (e.g., under CHF3: 15 sccm, Ar: 5 sccm, RF: 50 W, ICP: 300 W, Press: 7 mTorr). Top electrodes 1204 and 1224 that are orthogonal to the bottom electrodes 1202 and 1222 may then be deposited using, for example, electron-beam lithography, followed by, for example, electron-beam evaporation of Ag (e.g., 10 nm)/Au (e.g., 50 nm) (or other thin film structure) and a lift off process. In one example, the top electrode 1204 or 1224 may be created with a Lesker PVD-250 e-beam evaporator at a base pressure in the low $10^{-8}$ Torr range. The substrates may be rotated at 20 rpm or other speed while kept at room temperature utilizing a chilled-water cooling stage. The device active area, for example, may be 100-1000 nm by 100-500 nm, corresponding to the area of cross-sectional overlap between the top and bottom electrodes.

The ARS device may be packaged, for example, in a commercial TO-5 can and the electrodes were wire bonded to the package pins. The package ARS device may be integrated with an avalanche photodiode and other component according to FIGS. 8 and 9 for fast single photon detection. Since the distance between package pins may be several millimeters, the stray capacitance of the ARS package can be ignored. The current-voltage characteristics of the ARS device may be determined in various manners. For example, it may be measured using a semiconductor parameter analyzer (e.g., using a Keysight B1500A analyzer).

In ARS devices 1200 and 1220, when an electric field is applied between the top and bottom the electrodes, the dielectric layer exhibits voltage dependent resistance for facilitating high speed single photon detection. The voltage dependent resistance may be based on a mechanism such as the filamentary mechanisms or the IMT mechanisms in the dielectric layer or materials as discussed above. For example, the ARS devices 1200 and 1220 could be a filamentary device similar to a resistive random memory structure such as a conductive bridge random access memory (CBRAM) device. Examples of these devices are discussed for example, in the paper entitled "Conductive bridging random access memory materials, devices and applicants" in Semicond. Sci. Technol. 31, 113001, the entirety of which is incorporated herein by reference.

ARS Device Measurement

Figure 11A:
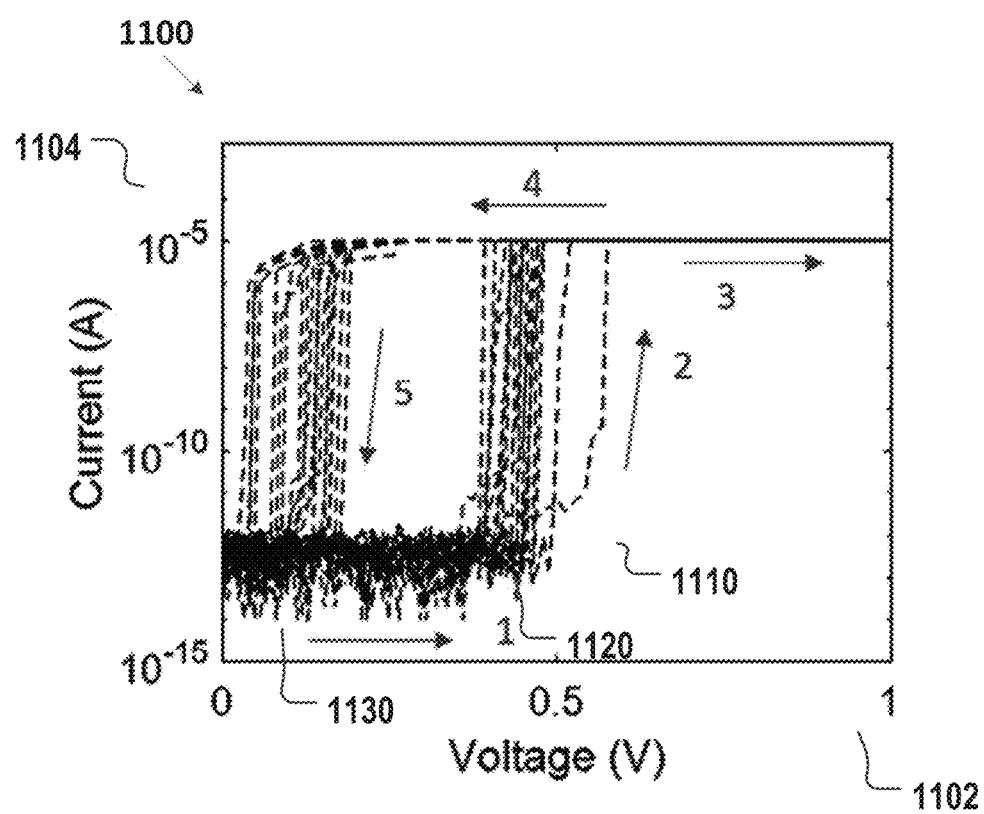
FIGS. 11*a* and 11*b* illustrate example I-V characteristics of an adaptive resistor.

FIG. 11a shows example I-V characteristic 1100 of example $Al_2O_3$ dielectric film resistors showing adaptive resistance switching behavior. In FIG. 11a, the x-axis 1102 represents a voltage drop (or bias) across the $Al_2O_3$ electric film resistors and the y-axis 1104 represents the current characteristics. As shown by the I-V curves 1110, under zero or low voltage drop, the $Al_2O_3$ dielectric film resistor is in an insulating or near-insulating phase and the current passing through the resistors are low. When the voltage drop is increased to a value higher than, for example, a switch or transition point of around 0.4 V (varies between each specific resistors), as indicated by 1120 in FIG. 11a and represented by $V_{t1}$, a conductive bridge (or one or more conduction filaments) is formed inside the $Al_2O_3$ film resistor and the resistance is shifted to low state. The current increases drastically (about $10^8$ times), as shown by the arrow pointing upward in FIG. 11a. In order to reverse to the original high resistance state, the voltage drop is decreased to a value lower than the switch point to stimulate the $Al_2O_3$ dielectric film resistor back into insulator phase, as indicated by 1130 (the conduction-to-insulation switch point varies between each specific resistor).

As shown in FIG. 11a, the I-V curve of the example $Al_2O_3$ film resistor shows a hysteresis behavior (as described above and shown by the arrows representing change of the voltage drop across the dielectric layer). Using such an $Al_2O_3$ film resistor with such hysteresis behavior as the quenching resistor $R_Q$ 104 in the photodetectors above provides a fast single photon detection response. Specifically, with reference to FIG. 8, when there is no photon illumination, the switch 306 is open, the bias V from the voltage source 110 drops on the photodetector junction capacitor $C_{pd}$ 308 and there is no electric current in the photo detector 800. Correspondingly, there is no voltage drop across $R_Q$ 104 and thus $R_Q$ 104 is in high resistance state. When there is single photon illumination, the switch 306 closes, and the photodetector junction capacitor $C_{pd}$ 308 is discharged. Since $V > V_{BR}$ (threshold reverse breakdown bias voltage of the diode 302), the discharge direction is through the diode 302. While discharging, the bias over the photodetector junction capacitor $C_{pd}$ 308 decreases, a current from the voltage source 110 is formed and begins to rise. Since the bias over the $Al_2O_3$ film resistor is low at this point, it is in insulator or near-insulator phase and its resistance is much larger than $R_{pd}$ 304. As such, the discharging speed of the photodetector junction capacitor $C_{pd}$ 308 via the diode is faster than charging speed from the voltage source. The rising speed of charging current 150 is dependent on the $R_{pd} C_{pd}$.

The insulating to conductive switching point ($V_{t1}$) of the $Al_2O_3$ film resistor may be designed so that the maximum bias across the $Al_2O_3$ film resistor of $I_{max}*R_{Al2O3}$) is right above $V_{tr1}$, where $R_{Al2O3}$ represents the resistance of the $Al_2O_3$ film resistor in high-resistance state. As a result, the $Al_2O_3$ film resistor may be transformed into a conductive state as the charging current 150 rises to $I_{max}$. During the same time, the bias over the photodetector junction capacitor $C_{pd}$ 308 drops below $V_{BR}$ and the avalanche process of the photo carriers is quenched, and the switch 306 is open again. Afterwards, only the charging process of the photodetector junction capacitor $C_{pd}$ 308 by the voltage source 110 exists. The speed of this charging process is now determined by the greatly reduced resistance $R_{Al2O3}$ multiplied by $C_{pd}$. The charging speed at his point is very fast since the $Al_2O_3$ film resistor is in conductive mode (e.g., about $10^8$ times faster than high resistance phase). The conductive to insulating switching point as indicated by 1130 of FIG. 11a may be designed to have a value smaller than $V_{t1}$ (e.g., approaching 0), so that it transform back to insulator phase when the photodetector junction capacitor $C_{pd}$ 308 is near full charge by the voltage source. As shown by FIG. 11a, the insulation-to-conduction and conduction-to-insulation switching points 1120 and 1130 may be adjusted for each specific resistor design.

The transition from the high resistance state to the low resistance state of the quenching resistor described above does not persist and the quenching resistor recovers its high resistance value after $C_{pd}$ 308 is charged and the bias across the quenching resistor decreases to around zero (similar to that shown in FIG. 11a). In other words, the transition from the high resistance state to the low resistance state is volatile. With such recovery to high resistance following detection of one single photon, the photo detector is ready to detect a next photon with a quenching resistance that is sufficiently high.

While the I-V characteristics of the quenching resistor above exhibits a desired volatile transition from the high resistance state to the low resistance state, such transition may be non-volatile in some other implementations. Specifically for these implementations, the quenching resistor may stay in low resistance state after quenching of the photo current and when the bias across the quenching resistor drops to close to zero, and a negative bias voltage across the quenching resistor may be applied via an auxiliary circuit to reset the resistance value of the quenching resistor to the original high value so that the photocurrent induced by a next photon can be properly quenched (if the quenching resistor persists in the low-resistance state without resetting, the photocurrent may not be quenched when detecting the next photon, as described above and shown in FIG. 5).

Other ARS Mechanisms

Figure 11B:
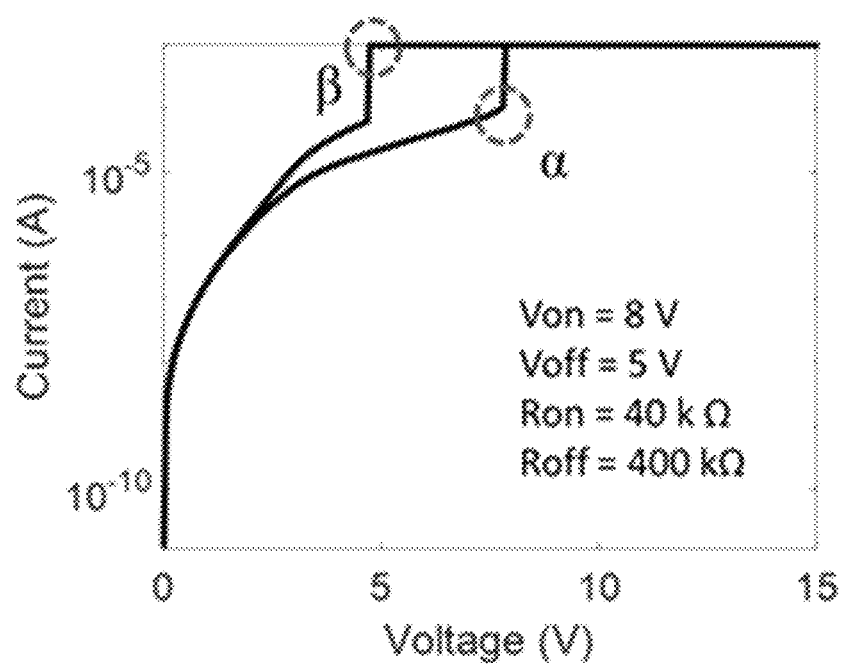

Alternative to the adaptive resistive element based on filamentary mechanism as described above, other types of resistive elements having bias voltage dependent resistivity may be used as the quenching resistor $R_Q$ 104 for achieving fast quenching. As another example, the quenching resistor $R_Q$ 104 may be based on oxide and/or chalcogenide materials that exhibit reversible electrically or thermally driven insulator-to-metal transition (IMT) properties. For example, an IMT) transition may be induced as a bulk process in the dielectric layer upon application of a voltage. In particular, the dielectric layer may reversibly transition from an insulating (high resistivity) state to a conducting (low resistivity) state. Such an IMT transition may occur because of, for example, a thermal heating induced by the applied voltage, or a purely electric field driven bulk effect. Such transition between resistive states due to bulk processes may also occur via a voltage driven phase transition of the dielectric material that results in a reversible resistance change. These transitions, while being bulk phenomena, may be nucleated via filamentary events. Such materials may include but are not limited to vanadium oxide ($VO_2$), vanadium sesquioxide ($V_2O_3$), titanium oxide ($TiO_2$), niobium oxide ($NbO_x$), hafnium oxide ($HfO_x$) and tantalum oxide ($TaO_x$). These oxide materials may undergo insulator-to-metal transition as a bias voltage is varied. In some instances, these oxide materials may exhibit I-V characteristics similar to that shown in FIG. 11 and described above (including the reversibility and hysteresis characteristics). Such I-V characteristics may result from an interplay between Joule heating, heat transport, and the physical properties of these material when electrically driven. The collective response of these material to external temperature, pressure and/or electric stimuli may be in a form of melting of carriers, resulting in an electronic phase transition where the electrons localized at atomic sites change to an itinerant state. Further details about IMT properties of these materials can be found the articles entitled "Electrically Driven Insulator-Metal Transition-Based Devices-Part I: The Electrothermal Model and Experimental Analysis for the DC Characteristics" and "Electrically Driven Insulator-Metal Transition-Based Devices-Part II: Transient Characteristics." Published in Volume 65 and No. 9 of IEEE Transactions on Electron Devices", on pages 3892-3995, and in September, 2019, the entirety of which are herein incorporated by reference.

SPAD Device Structure and Fabrication

Figure 13:
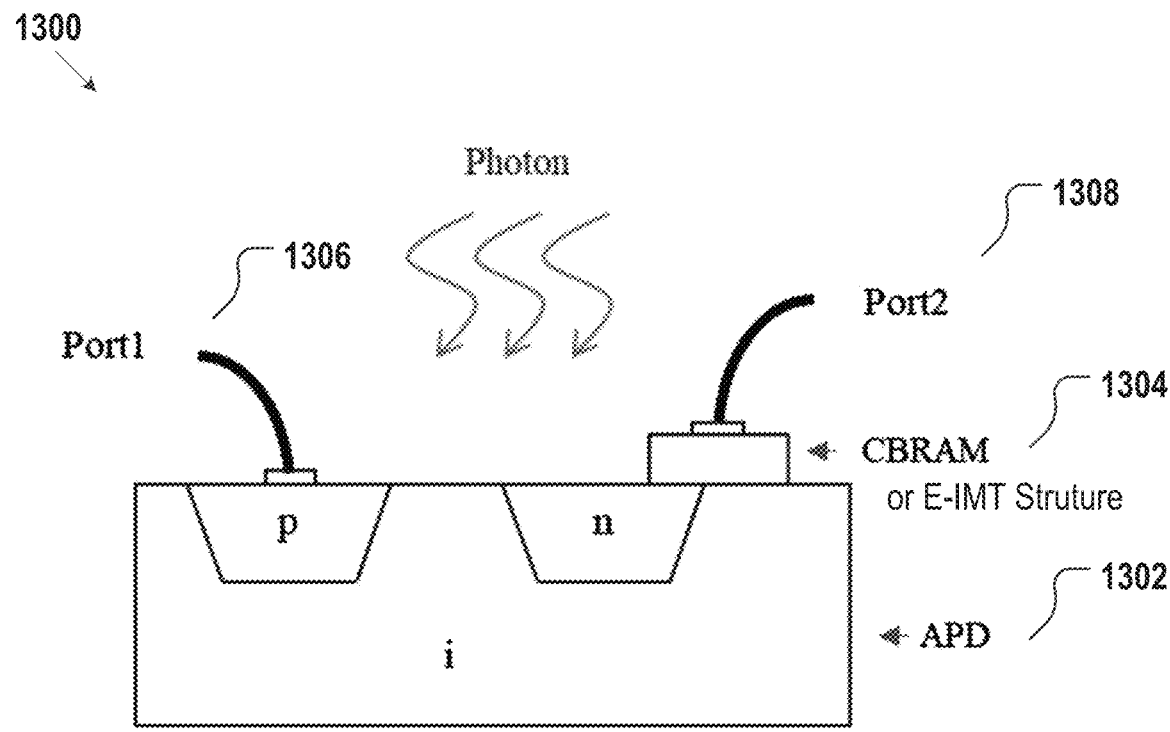
FIG. 13 shows cross-sectional view of an example photodetector device incorporating an avalanche photodiode and an adaptive quenching resistor according to one implementation.

FIG. 13 further illustrates a cross-sectional view of an example photodetector device 1300 incorporating quenching resistor structure similar to that of FIG. 12. The illustrated implementation of the photodetector device 1300 includes an avalanche photodiode 1302 and a dielectric structure 1304 functioning as an adaptive quenching resistor. The APD device 1300 is configured as a two-terminal (or two-port) device having terminals 1306 and 1308. The avalanche photodiode structure 1302 of FIG. 13 includes a p-i-n structure. The avalanche photodiode structure 1302 is connected in series with the CBRAM or IMT structure 1304 (the quenching resistor). The APD device 1300 of FIG. 13 may be used for single photon detection. A sensing circuitry and external bias may be applied via the terminals 1306 and 1304 following the configuration shown in FIG. 1. In some other implementations, the dielectric device structure 1304 may be placed over the p-region rather than the n-region of the avalanche photodiode 1302, and the sensing circuitry and the external bias may be correspondingly connected to the two terminals 1306 and 1308 following the configuration illustrated in FIG. 2. The photodetector device may be configured to receive and detect incident single photons, as shown in FIG. 13.

Figure 14:
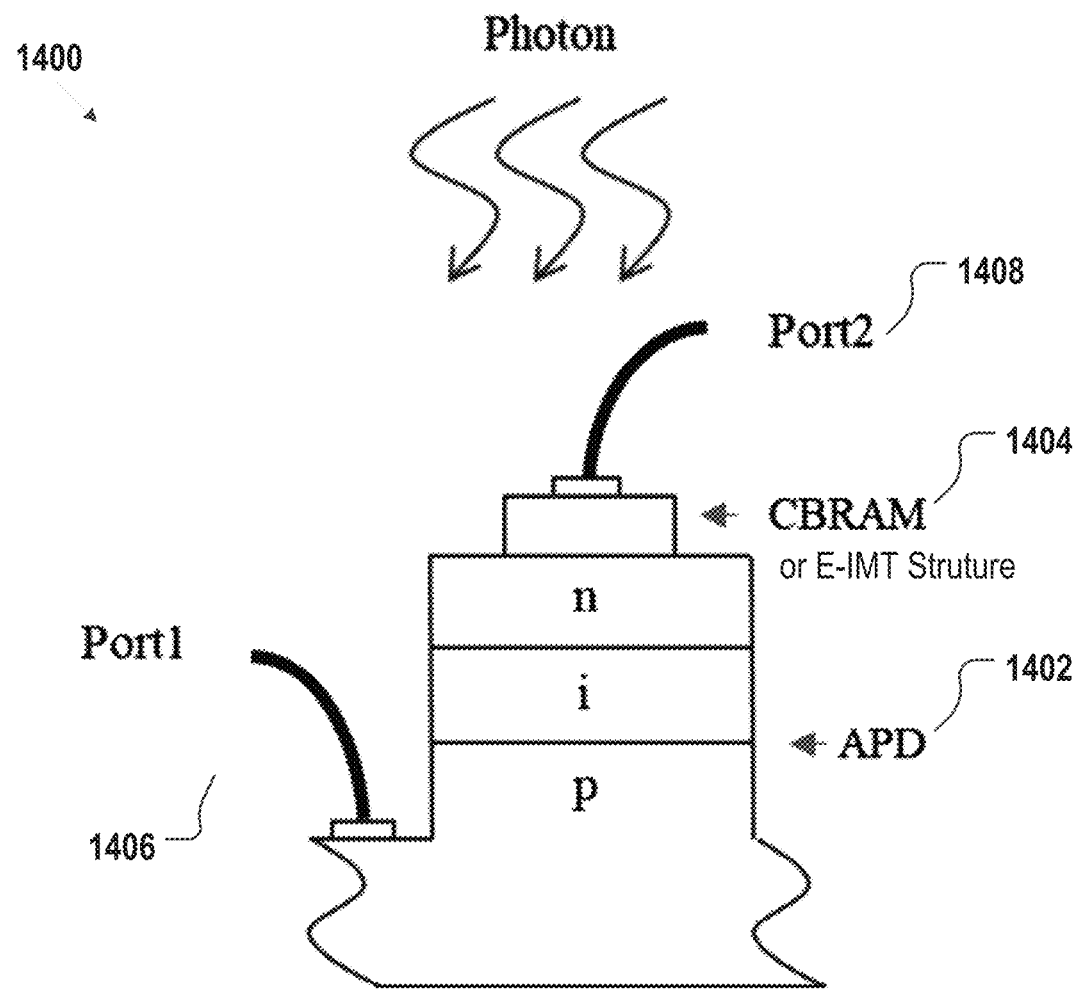
FIG. 14 shows cross-sectional view of another example photodetector device incorporating an avalanche photodiode and an adaptive quenching resistor according to one implementation.

FIG. 14 illustrate cross-sectional view of another example photodetector device 1400 alternative to the device 1300 of FIG. 13. The device 1400 includes an avalanche photodiode structure 1402, a dielectric device structure 1404 functioning as the adaptive quenching resistor, and two terminals 1406 and 1408. The device 1400 functions similarly to the device 1300. In the device 1400, the n-i-p structure forming the avalanche photodiode 1402 is implemented as vertically stacked layers rather than the lateral configuration for the avalanche photodiode 1302 in FIG. 13.

As disclosed above, by using a dielectric structure whose resistivity varies spontaneously with the voltage applied across it (as described above) as the quenching resistor, the response speed of the SPAD can be enhanced by a factor of up to 10-100 or more. In some other implementations, a generic passive or active structure having adaptive impedance (not necessarily resistance) may be used in conjunction with other circuitry to achieve fast quenching of a SPAD.

Single Photon Detection Measurements of Example SPAD Based on ARS

As an example for illustrating the principles of operations described above, an SPAD system is constructed using silicon APD (Hamamatsu S14643-02) with a sensing diameter of 200 µm connected in series with a quenching resistors (either ARS or fixed passive resistors) for single photon detection measurements. Periodic single-photon pulses with various repetition rate are generated and incident on the SPAD and the current flowing through the SPAD is derived directly via readout from an oscilloscope.

Figure 20:
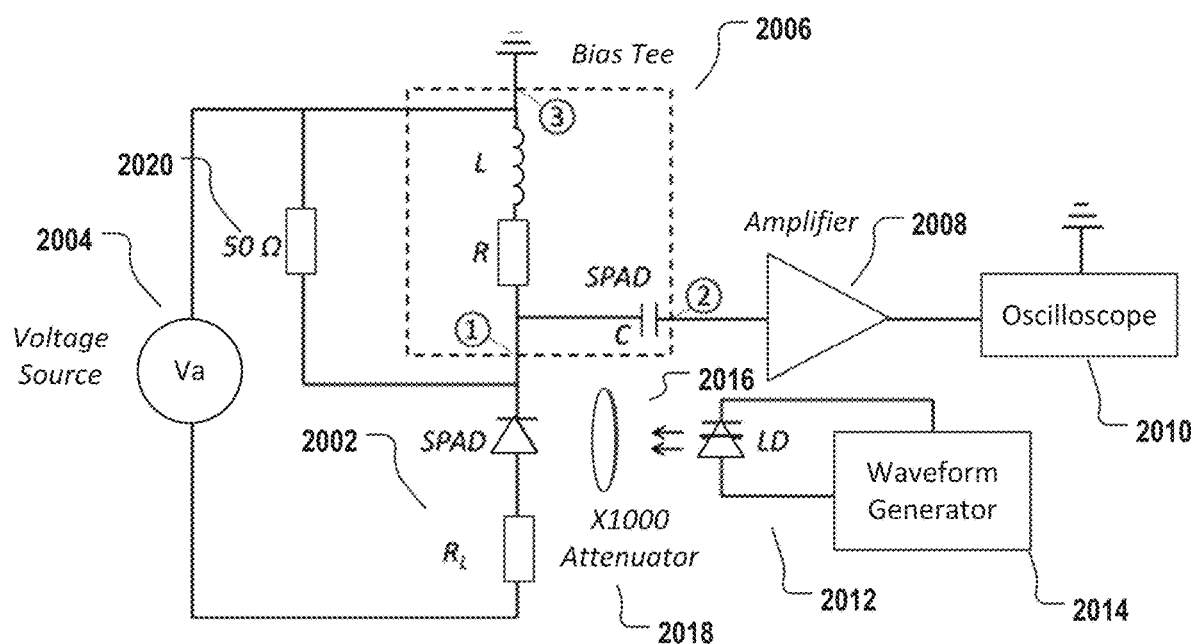
FIG. 20 illustrates measurement configuration for testing a single photon detection APD.

An example configuration for single photon detection measurements is shown in FIG. 20. As shown in FIG. 20, the SPAD system 2002 may be driven by a DC voltage source (e.g., Keithley 2400) 2004. A bias tee (e.g., ZFBT-4R2GW+) 2006 may be used to extract the AC signal from the output of the SPAD. The bias tee may include three ports, e.g., DC+AC input port (port ① in FIG. 20), AC output port (②), and DC output port (③). In various measurements, the bias tee 2006 is used to extract the avalanche pulse (port ②) from the DC background (port ③) and protect the oscilloscope from burning. The avalanche pulse is then introduced into a low noise amplifier 2008 (e.g., ZFL-1000LN+) and read out using an oscilloscope 2010 (e.g., Rigol DS7024). A laser 2012 (e.g., Thorlabs L520P120) at, for example, 520 nm, driven by, for example, a Keysight 33600A waveform generator 2014 delivers the light pulse 2016 to the SPAD. The responsivity of the Si SPAD at 520 nm (e.g., 0.2 A/W at a bias of 20 V with gain=1) enables calibration of the input light intensity using the photocurrent read by the DC voltage source 2004. The laser drive voltage may be set so that the corresponding photon number in each pulse averages to ~1000. The laser pulse is then attenuated to 1 photon/pulse by a ×1000 attenuator 2018 (e.g., Thorlabs NDUV530B). The current flowing through the SPAD system is derived from the voltage readout (at the oscilloscope 2010) divided by the voltage gain of the low noise amplifier 2008 multiplied by an AC port output impedance of, for example, 50Ω (as indicated by 2020). The avalanche pulse shape studies may be carried out with the laser repetition rate of, for example, 1 MHz and other rates, and with the response of the SPAD system recorded at a scanning step of, for example, 0.4 ns.

The example ARS, when used as the quenching resistor R4, includes 5 nm $Al_2O_3$ dielectric layer sandwiched by a Ti (5 nm)/Pt (50 nm) bottom electrode and an Ag (10 nm)/Au (50 nm) top electrode. The top and bottom electrodes (each fabricated with 200 nm width) are orthogonally configured, based on a "cross-bar" device geometry.

Figure 15A:
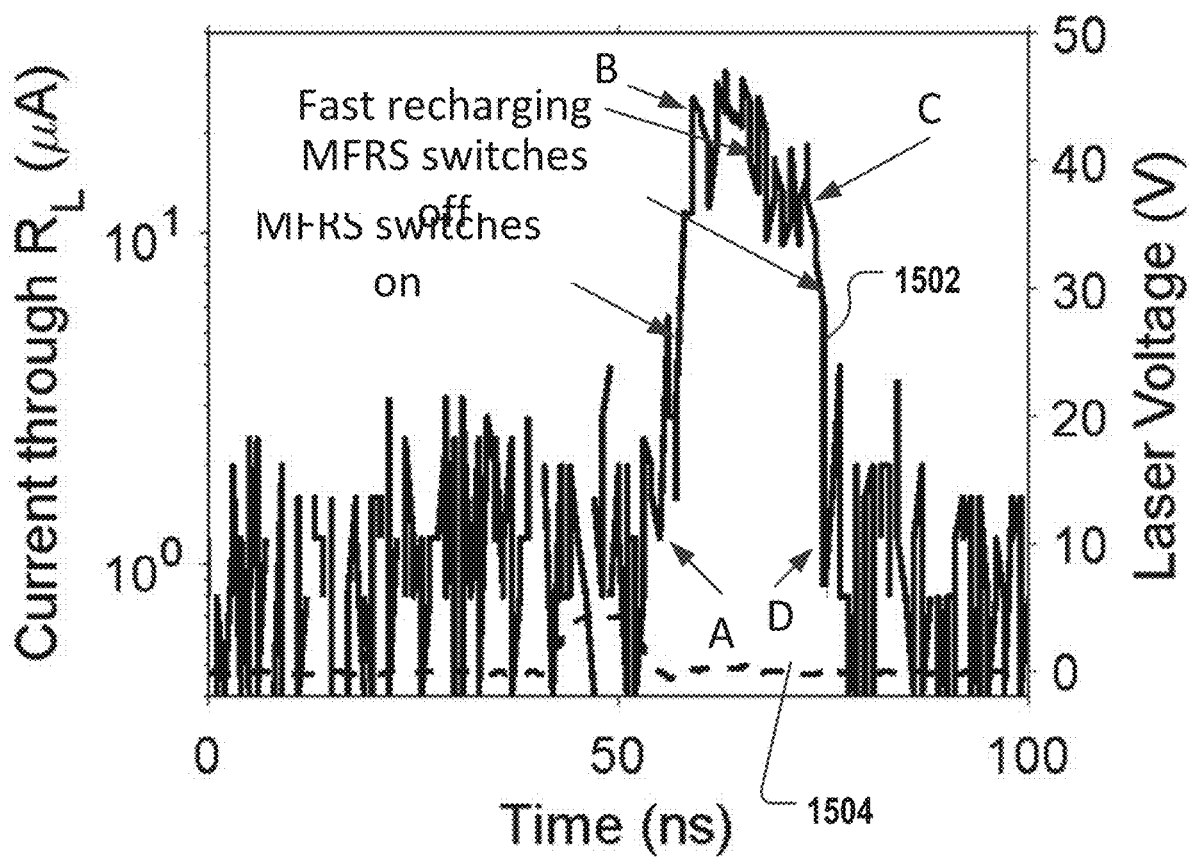
FIG. 15*a* shows response of an example photodetector using a Si APD and incorporating an adaptive quenching resistor.
Figure 15B:
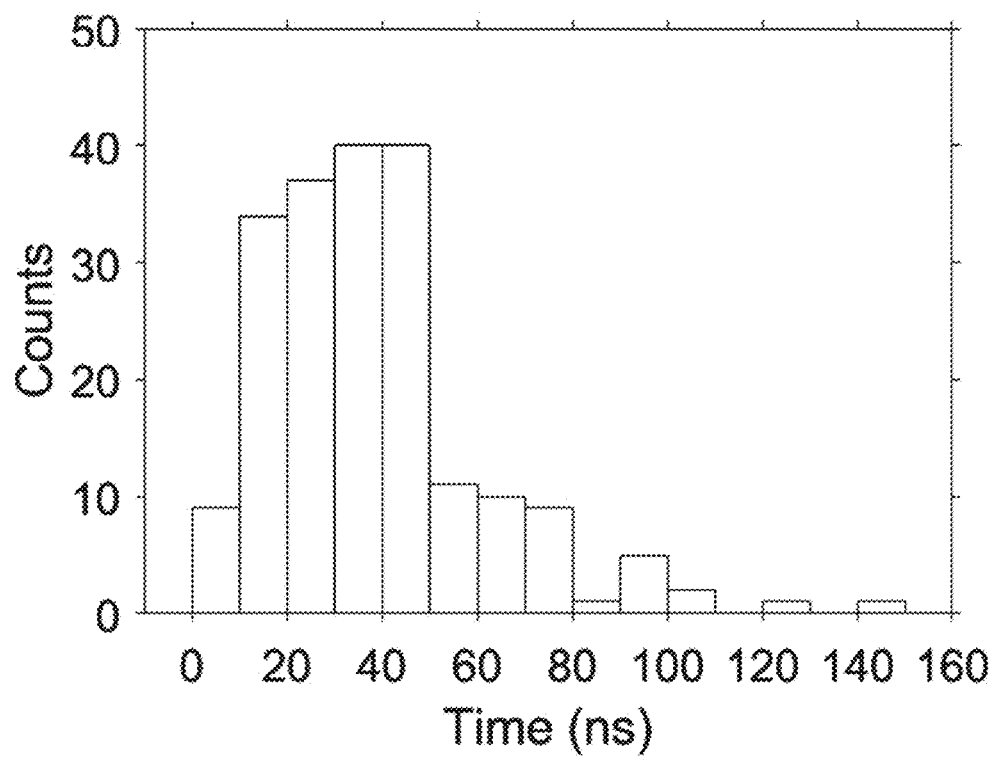
FIG. 15*b* shows a histogram of single photon detection response time for an example photodetector using a Si APD and incorporating an adaptive quenching resistor.

When the ARS is used as a quenching resistor R4, a typical single-photon triggered avalanche pulse shape (current flowing through the SPAD as a function of time) is shown as curve 1502 in FIG. 15a. Four inflection points are marked in curve 1502 as (A, B, C, D). The driving voltage of the laser that provide the single-photon trigger is shown as curve 1504. As will be further compared below, the pulse shape 1502 has a significant difference from those observed in measurements with conventional passive quenching (i.e., with a fixed resistor). For the current trace in curve 1502 of FIG. 15, the current (A→B) rise may potentially be attributable to the discharging process of the SPAD, followed by B→C and C→D which potentially corresponds to recharging process of the APD capacitor. If this were the case, then the quenching resistance during B→C period is larger than that during C→D period (since the B→C segment slope is lower than the C→D segment). This would imply that the switch to the low-resistance state of the ARS occurred around point C, and there should then be a significant rise in the SPAD current at the C, which was not observed. Therefore, it may be inferred that the discharging (quenching) and the switching of the ARS may have occurred by the time point A is reached (~7 ns after the peak of the laser drive voltage) in the current versus time measurement of FIG. 2a. This is indeed expected considering estimates of the timescales involved: the RC time constant for discharging the APD capacitor is ~700 ps for a junction capacitance of 0.7 pF (according to the datasheet of the APD) and a diode resistance of 1 kΩ. It follows that ~90% of the stored energy would be discharged in ~1.6 ns from discharging Eqs. (1) and (2) described above. In contrast, resistive switches may occur on timescales of ~100 ps to a few ns. Based on the expectations from these estimates, It thus appears that at point A the SPAD has already completed its discharge, and segment A→B is caused by the ARS switching from the off (high-resistance) to the on (low-resistance) state. Segment B→C represents the fast recharging period with the ARS in the "on" state. When the voltage across the ARS drops below a critical value (the "off" voltage) at point C, the ARS reverts to the "off" state (or high resistance), leading to the C→D segment. Further analysis of this behavior via simulations is described later in this disclosure. A statistical analysis of the recovery times taken over 200 avalanche pulses, and the recovery time distribution is shown in the histogram of FIG. 15b. Most pulses have a short recovery time (<50 ns), and the averaged recovery time is estimated as 37.3 ns.

In some implementations, the duration in which the photocurrent pulse is quenched may be less than 200 nanoseconds, 150 nanoseconds, 125 nanosecond, 100 nanoseconds, 90 nanoseconds, 80 nanoseconds, 70 nanoseconds, . . . or 5 nanoseconds.

The quasi-static current-voltage (I-V) measurement of the ARS resistor before the quenching experiment of FIG. 15 is shown in FIG. 11a and described above. In further detail, a compliance current (e.g., 1 mA) is used to restrict the conducting filament thickness to keep the ARS device under a "volatile mode" (i.e., a reversible return to the high resistance state at V=0). As can be seen, the "on" voltage is ~0.5V, the "off" voltage is ~0.1 V, and the off-state leakage is <1 pA. Following repeated operations during the experiments, the "on" and "off" switching voltages drift upwards, with an increase in leakage current. This can be seen in the I-V characteristics shown in FIG. 11b, taken after $~10^{10}$ avalanche triggers at periodical operation single-photon signal. The "on" and "off" switching voltage have drifted upwards to 8 and 5 V, respectively, and off-state and on-state resistances at this condition are ~400 kΩ, and ~40 kΩ, as calculated from the measured voltage divided by a current at the inflection point (α and β as marked in FIG. 11b). Consequences of this drift in relation to degradation is discussed later. This degradation related to material imperfection and may be improved through materials development.

In some implementations, the "on" resistance of the ARS may be may be many orders of magnitude smaller than the "off" resistance. For example, the "on" resistance may be 1-15, or more orders of magnitude higher than the "off" resistance.

Figure 16A:
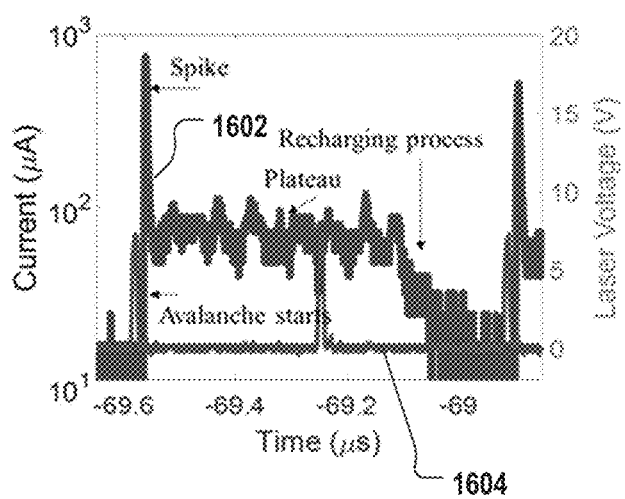
FIG. 16*a* shows an example response pulse shape of an APD with fixed quenching resistor.
Figure 16B:
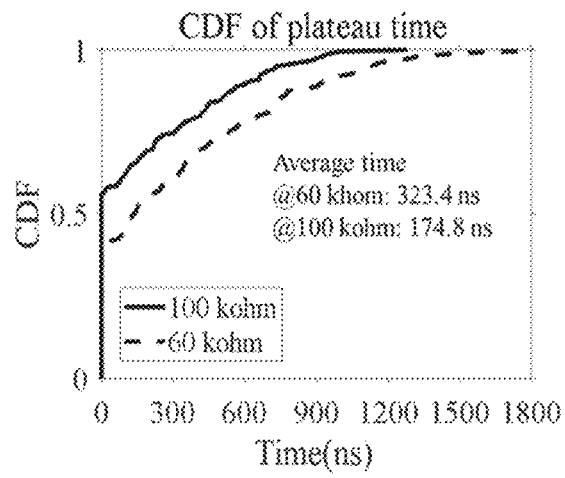
FIGS. 16*b* and 16*c* show a cumulative distribution functions of the two different response features of FIG. 16*a* for two different quenching resistor values.
Figure 16C:
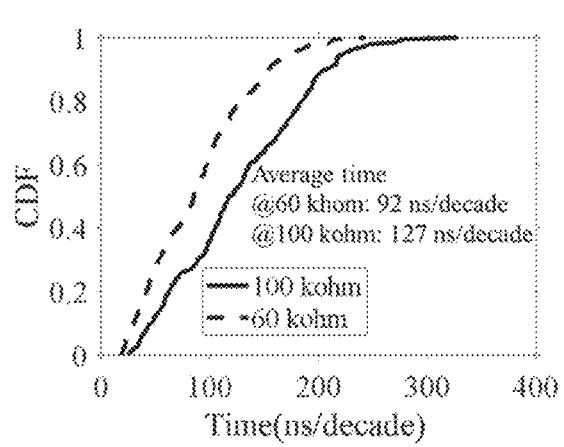
Figure 16D:
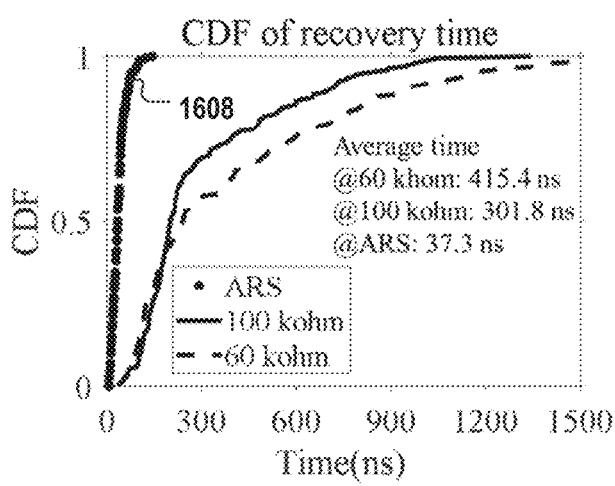
FIG. 16*d* shows a cumulative distribution function of a total recovery times of an APD for two different two different quenching resistor values and for an adaptive quenching resistor.

In order to achieve a comparable (to the ARS-based results) recovery time of ~37 ns using conventional passive resistance quenching, it is estimate (using Eq. (3) above) that the resistance would need to be ~23 kΩ, using a junction capacitance of 0.7 pF for the APD (according to the datasheet of Hamamatsu S14643-02). However, such a small resistance value is not expected to be adequate to quench the avalanche process (because the APD capacitor would be significantly charged by the voltage source so that the reverse bias across the APD would not fall below the threshold reverse breakdown voltage). For example, when a 30 kΩ fixed resistor in series with the SPAD is used, the avalanche sustained itself and does not quench. The sustained high current degrades the APD, and the avalanche response current became noisy within seconds, followed by burnout of the APD. Quenching experiments on the same SPAD type with quenching resistors fixed at 60 kΩ and 100 kΩ are shown in FIGS. 16a-16d. The estimated recovery times are 97 ns/decade and 161 ns/decade, respectively. In these cases, the APD could be quenched, but the recovery times were significantly longer than the ARS case. The measured avalanche pulse response shown as 1602 in FIG. 16a indicates three features: a spike, a plateau, and a recharging process. Curve 1604 shows driving signal for the laser. The spike may have originated from the fast charging of the quenching resistor's stray capacitance (in the form of a chip resistor). However, no such a spike is observed for ARS quenching (FIG. 15a). The absence of the spike for ARS case may be due to the fact that the ARS is mounted on a TO-5 can package and the lead pitch (5.08 mm) is much larger than the bottom termination distance of the chip resistor (0.3 mm) used in the conventional quenching method. Since the stray capacitance in the ARS is parallel to the ARS, the capacitance is inversely proportional to the lead pitch. Thus, the stray capacitance is much smaller and can be ignored in ARS. The plateau in FIG. 16a may be due to a sustained avalanche that occurs when the quenching resistance is not large enough. The variation in the duration of the plateau may be a consequence of the probabilistic nature of the quenching process. The formation of the plateau is observed for both the 60 kΩ and 100 kΩ cases. Measurements made over 200 avalanche pulses (plotted in FIGS. 16b and 16c) indicates that the measured averaged plateau time widths are 323.4 ns/174.8 ns (60 kΩ/100 kΩ, in FIG. 16b, dashed and solid curves, respectively) and the measured recharging times are 92 ns/decade/127 ns/decade (60 kΩ/100 kΩ, in FIG. 16c, dashed and solid curves, respectively). As shown in FIG. 16d, this leads to significantly larger average recovery times (including plateau and recharge) times of 415.4 ns/301.8 ns (60 kΩ/100 kΩ, dashed and solid curve respectively), compared to the ARS case (~37.3 ns, curve 1608). The measured average recharging times shown in FIG. 16c are comparable to the calculated recharging times from Eq. 3 (97 ns/decade and 161 ns/decade). While increasing the quenching resistance would reduce the plateau width, this would also further increase the recharging time. For instance, it may be estimated using Eq. (3) that for a 200 kΩ quenching resistor, the recovery time would be ~322 ns. As a result, the passive quenching will lead to recovery times>8× longer than the averaged recovery time of the ARS quenching, where the resistance change can decouple the opposing demands on resistance for quenching and recharging. The typical recovery time for conventional passive quenching of SPADs with large sensing area (diameter>100 µm) may be 500 ns to 1 µs. The use of ARS can significantly improve the response speed of SPADs. To achieve comparable speeds using conventional passive quenching would require reducing the sensing area to around 10 µm, which complicates optical coupling and can result in reduced sensitivity.

The impact of faster recovery times is further illustrated in high repetition rate (20 MHz) single-photon measurements shown in FIGS. 17(a) and 17(b). Representative avalanche responses (across 1.6 µs time windows) are shown both for the ARS (FIG. 17a) and conventional passive quenching (100 kΩ) case (FIG. 17b). The comb curves 1702 and 1704 indicate the single-photon drive voltage, and curves 1706 and 1708 are the SPAD signal. Statistical analysis of the data was carried out using single-photon response data over 0.4 ms with a time step resolution of 0.4 ns. There are 8000 single-photon pulses involved in the analysis. The single-photon counting rate under 20 MHz single-photon repetition rate is 1.8 MHz for conventional passive quenching (100 kΩ) and 9.3 MHz for ARS quenching. The results are consistent with the faster recovery times of the ARS based measurements.

Figure 18:
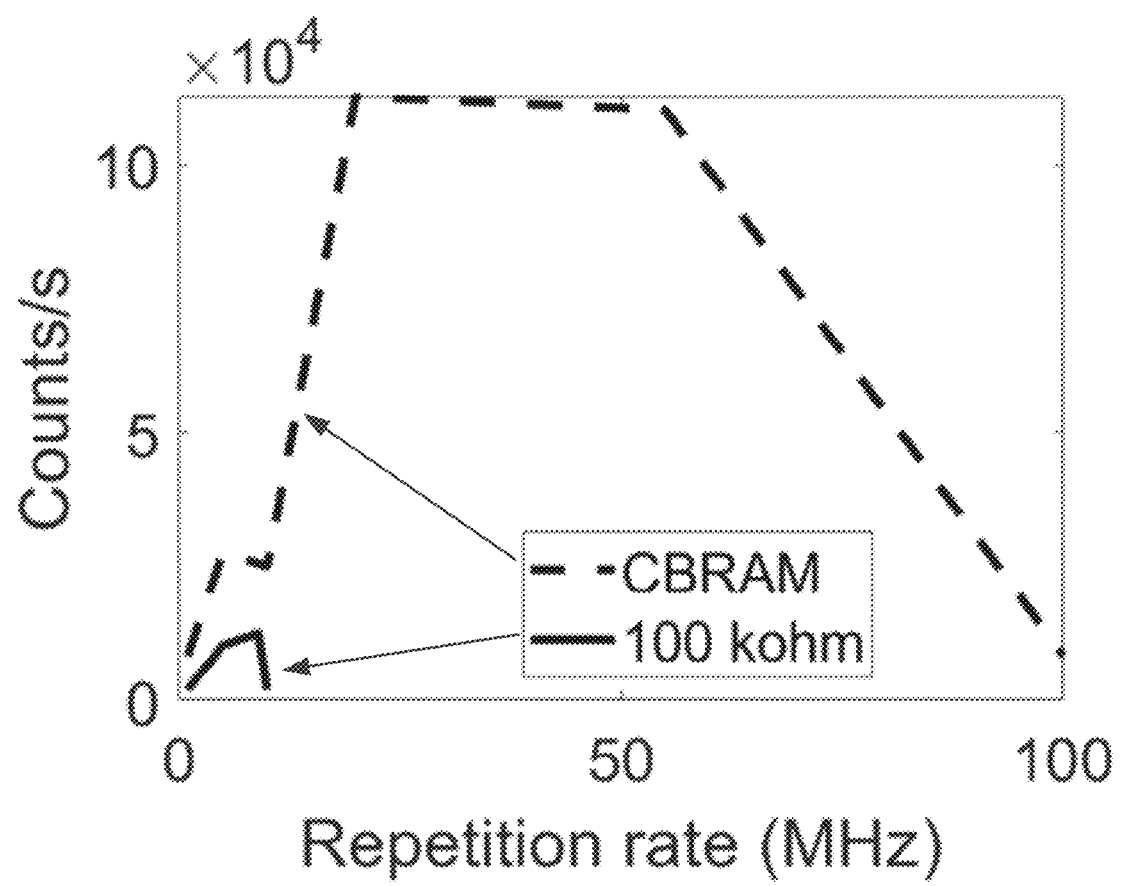
FIG. 18 shows single photon response as a function single photon repetition rate using an example avalanche photo diode with an adaptive resistor.

FIG. 18 further illustrates high repetition single photon detection using an SPAD with an adaptive quenching resistor described above or a quenching resistor fixed at 100 kΩ. In particular, an attenuated periodical laser pulse is used to illuminate the SPAD system to simulate a single photon sequence and to trigger avalanches of photocurrent. The output of the SPAD is read by a counter. The results shown in FIG. 17 illustrate that while it is difficult for the SPAD with fixed 100 kΩ quenching resistor to detect the laser signal faster than 10 MHz (100 ns), the SPAD with ARS quenching resistor can still function as high as 100 MHz (10 ns).

Simulation

Figure 19:
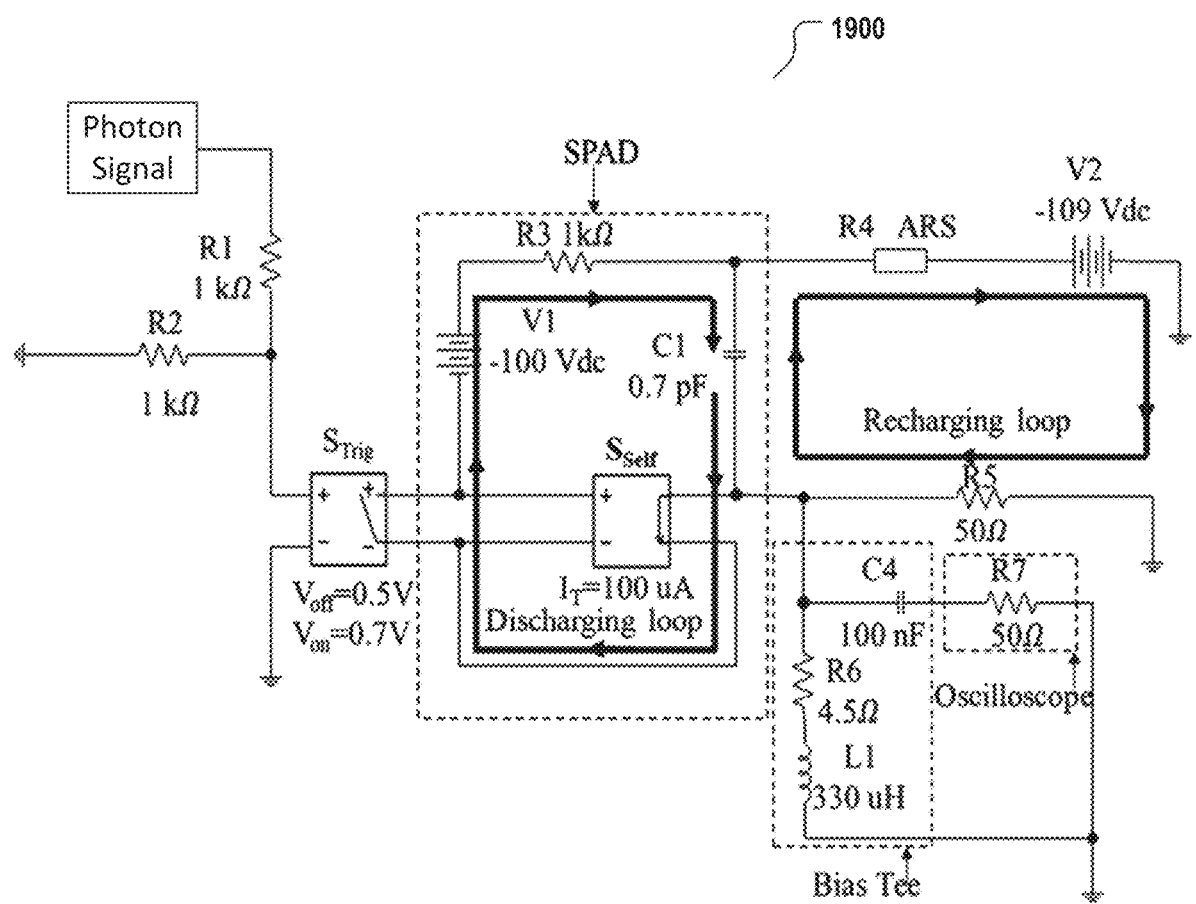
FIG. 19 illustrates a PSPICE model for simulating a single photon detection APD.

OrCAD PSPICE Designer is used to simulate the quenching process above. The circuit schematic of the SPAD system for simulation is shown as 1900 in FIG. 19. The photon signal port, resistances R1, R2, and the switches $S_{Trig}$ and $S_{Self}$ as included in FIG. 19 represent the switch 306 in FIGS. 2, 3, and 8. V1 and R3 represent the equivalent internal voltage source (reverse breakdown voltage) and the SPAD internal resistance, respectively. C1 represents the SPAD junction capacitance. The optical switch sub-circuit, V1, R3, and C1 form the equivalent circuit of the SPAD. The quenching resistance is represented by R4 (ARS with PSPICE model embedded in). V2 represents the external voltage source. R5 is the 50Ω matching resistor. Components C4, R6, and L1 form a bias tee, which separates the AC and the DC signal. The values of R6 are given by the data sheet of the bias tee ZFBT-4R2GW+, and C6 and L1 estimated in other manners. The AC signal is introduced from C4 into an oscilloscope, whose input impedance is 50Ω (R7). In the simulation, we track the current flow through R7, the voltage across SPAD, and the voltage and current on the ARS resister (R4) during quenching. The photon signal port generates a voltage pulse with a pulse width of 1 ps whose rising edge triggers the switching (closure) of a voltage-controlled switch $S_{Trig}$. When $S_{Trig}$ switches on (i.e., closes), C1 discharges through an internal loop (labelled as "discharging loop" in FIG. 19: C1→R3→V1→$S_{Trig}$→$S_{Self}$→C1). The discharge current exceeds the threshold of the current-controlled switch $S_{Self}$, leading to its closure when discharging begins. The falling edge of the electric pulse leads to the reopening of the voltage-controlled switch $S_{Trig}$. The current controlled switch threshold is set to be 100 µA (latching current of self-sustainable avalanche). When discharging ends, the current flow through $S_{Self}$ equals the excess bias (the difference between external voltage and breakdown voltage) divided by the total resistance (the sum of the quenching resistance and diode resistance). If the current is below 100 µA, $S_{Self}$ opens, and the avalanche is quenched. Otherwise, the avalanche continues unquenched. A PSPICE model of the ARS R4 was built using the following equations to describe the behavior of the ARS:

$$I = x^{-1} V_M \tag{5}$$

$$\frac{dx}{dt} = f(V_M) W(x, V_M) \tag{6}$$

$$f(V_M) = \beta \times \left[ V_M - \frac{1}{2}(V_{on} + V_{off}) - \frac{1}{2}(|V_M - V_{off}| - |V_M - V_{on}|) \right] \tag{7}$$

$$W(x, V_M) = \theta(V_{on} - V_M)\theta\left(1 - \frac{x}{R_{off}}\right) + \theta(V_M - V_{off})\theta\left(\frac{x}{R_{on}} - 1\right) \tag{8}$$

where I and $V_M$ are the current and voltage on the ARS, x is the resistance of the ARS, denotes a resistance transition speed (the unit is Ω/(s·V)). $V_{on}$, $R_{on}$, $V_{off}$, and $R_{off}$ are switch on voltage, on-state resistance, switch off voltage, and off-state resistance of the ARS. It is estimated form other measurement above that $V_{on}$=8 V, $V_{off}$=5 V, $R_{on}$=40 kΩ, and =400 kΩ. The response varies as a function of β and it is found that the switching speed is greatly influenced by the factor β. β may be in the $1\times10^{14}$ Ω/(s·v) range to be able to show a similar response to experimental results. In the paper, β is assumed to be $1\times10^{14}$ Ω/(s·V) to accommodate the ~ns level rising and falling speed of the response curve. Further, θ is the smoothed step function as shown in Eq. 9, which is set to avoid convergence problems:

$$\theta(x) = \frac{1}{1 + e^{-x/b}} \quad (9)$$

$$|x| = x[\theta(x) - \theta(-x)]. \quad (10)$$

Here, b is a smoothing parameter (estimated to be b=1× $10^{-8}$). Eq. 10 defines the absolute value function by using the step function.

For the simulation, the switching voltages and resistances of the ARS are extracted from the I-V measurement results, The ARS "on" and "off" time constants were empirically set at the level of 1 ns.

The simulation results are shown in FIGS. 17c and 17d. In FIG. 17c, the response current is shown in solid curve while the excess bias, which is defined as the voltage across SPAD minus breakdown voltage is shown in dashed curve. The shape of the solid current curve is similar to that observed in the experiment. The abrupt voltage drop across the SPAD illustrates how the discharge proceeds (1 ns-4 ns). After the discharge, the ARS starts to switch and generates an avalanche pulse output with A→B→C→D periods similar to the experimental results shown in FIG. 15a. FIG. 17d shows the voltage across the ARS (1712) and the ARS resistance (1710). Using relevant physical parameters, the simulations show that with the triggering of an avalanche, the junction capacitor of the SPAD discharges and the ARS switches from its high (400 kΩ) to low (40 kΩ) resistive states in 4.7 ns (A→B).

It should be noted that point A (t=2.47 ns in FIG. 15a) occurs during the discharging period (1 ns-4 ns), after the voltage across the ARS exceeds 8 V. As a result of switching-on, the current increases, and the recharging process is then accelerated (B→C in FIGS. 17c and 17d). During the fast recharging, the excess voltage across the SPAD increases to 4V (dashed curve in FIG. 17c), and the voltage on the ARS is reduced to below 5 V (solid curve in FIG. 17d). As a result, the ARS switches off (C→D in FIG. 17d). The recharging process then decelerates (C→D in FIG. 17c). The shape of the simulated SPAD response is consistent with experimental observations, which is consistent with a model where the ARS switches resistance from the high to the low state during the SPAD discharge and recharge process of the SPAD, thereby significantly reducing SPAD reset times.

Returning to discussing the drift in the ARS characteristics, as was noted earlier with respect to FIGS. 11(a) and 11(b), the "on" and "off" voltages drift upwards with operation from 0.5 V/0.1 V to 8 V/5 V following repeated operation. However, data for the I-V performance of FIG. 11(c) were collected during a short period of time when the behavior of the ARS did not change appreciably. Such drift can arise from microstructural changes during the conducting filament formation and dissolution in the ARS leading to eventual device degradation. The device endurance, for example, may be improved by using alloy electrode like Ag—Te, Ag—Cu, inserting Ag diffusion barrier layer, area scaling of the device switching region, using host materials with stronger chemical bonding among its components, and/or nitridation. It is anticipated that resistance to such microstructural degradation for the case of the ARS may similarly be achieved by designing optimized electrode, switching structures, adjusting resistor area, new host matrix and electrode materials, and the introduction of solute additives that can retard diffusive processes that exacerbate microstructural fatigue.

The description and accompanying drawings above provide specific example embodiments and implementations. Drawings containing device structure and composition, for example, are not necessarily drawn to scale unless specifically indicated. Subject matter may, however, be embodied in a variety of different forms and, therefore, covered or claimed subject matter is intended to be construed as not being limited to any example embodiments set forth herein. A reasonably broad scope for claimed or covered subject matter is intended. Among other things, for example, subject matter may be embodied as methods, devices, components, or systems. Accordingly, embodiments may, for example, take the form of hardware, software, firmware or any combination thereof.

Throughout the specification and claims, terms may have nuanced meanings suggested or implied in context beyond an explicitly stated meaning. Likewise, the phrase "in one embodiment/implementation" as used herein does not necessarily refer to the same embodiment and the phrase "in another embodiment/implementation" as used herein does not necessarily refer to a different embodiment. It is intended, for example, that claimed subject matter includes combinations of example embodiments in whole or in part.

Unless defined otherwise, all technical and scientific terms used herein have the same meaning as commonly understood by one of skill in the art to which the invention pertains. Although any methods and materials similar to or equivalent to those described herein can be used in the practice or testing of the present invention, the preferred methods and materials are described herein.

In general, terminology may be understood at least in part from usage in context. For example, terms, such as "and", "or", or "and/or," as used herein may include a variety of meanings that may depend at least in part on the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Reference throughout this specification to features, advantages, or similar language does not imply that all of the features and advantages that may be realized with the present solution should be or are included in any single implementation thereof. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One of ordinary skill in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

The invention claimed is:

1. A photodetector, comprising:
a first electrical port;
a second electrical port;
an avalanche photodiode comprising a first terminal and a second terminal, the second terminal of the avalanche photodiode is electrically coupled to the second electrical port; and
an adaptive photocurrent quenching resistor electrically coupling the first terminal to the first electrical port, wherein:
the adaptive photocurrent quenching resistor comprises a dielectric layer with reversible bias-voltage dependent resistivity.

2. The photodetector of claim 1, wherein:
the first terminal comprises a cathode of the avalanche photodiode; and
the second terminal comprises an anode of the avalanche photodiode.

3. The photodetector of claim 1, wherein:
the first terminal comprises an anode of the avalanche photodiode; and
the second terminal comprises a cathode of the avalanche photodiode.

4. The photodetector of claim 1, wherein the dielectric layer of the adaptive photocurrent quenching resistor is characterized by a reversible electrically or thermally driven insulator-to-metal phase transition property.

5. The photodetector of claim 1, wherein the dielectric layer of the adaptive photocurrent quenching resistor is characterized by a reversible bias-dependent electrical filamentary formation.

6. The photodetector of claim 5, wherein the resistivity of the dielectric layer has a high value when the bias-voltage across the dielectric layer is zero, the resistivity of the dielectric layer changes from high value to a low value when the bias-voltage across the dielectric layer is increased above a first threshold voltage, and then recovers to the high value when the bias-voltage is subsequently decreased below a second reverse threshold voltage.

7. The photodetector of claim 6, wherein:
the first reverse threshold voltage is lower than the second reverse threshold voltage; or
the first reverse threshold voltage equals the second reverse threshold voltage.

8. The photodetector of claim 5, wherein the resistivity of the dielectric layer has a high value when the bias-voltage across the dielectric layer is zero, the resistivity of the dielectric layer changes from the high value to a low value when the bias-voltage across the dielectric layer is increased above a threshold voltage, and then recovers to the high value after the bias-voltage is subsequently reversed in polarity to reset the electrical resistivity to the original high value.

9. The photodetector of claim 5, wherein:
the avalanche photodiode comprises a P-N junction characterized by a threshold reverse breakdown bias voltage; and the photodetector further comprises a voltage source connected to the first electrical port and the second electrical port to supply a predetermined voltage such that the avalanche photodiode is reversely biased above the threshold reverse breakdown bias voltage of the P-N junction without photocurrent flowing in the avalanche photodiode.

10. The photodetector of claim 9, wherein the avalanche photodiode, upon stimulation by a single or more incident photons, is configured to excite multiple photoelectrons to generate a photocurrent pulse which is subsequently quenched by the adaptive photocurrent quenching resistor.

11. The photodetector of claim 10, wherein the adaptive photocurrent quenching resistor exhibits a spontaneous change of resistance before, during, and after the photocurrent pulse is quenched.

12. The photodetector of claim 11, wherein the adaptive photocurrent quenching resistor possesses a high resistance prior to the generation of the photocurrent pulse, spontaneously reduces its resistance from the high resistance to a low resistance as the photocurrent pulse is quenched, and recovers the high resistance after the photocurrent pulse is quenched.

13. The photodetector of claim 12, wherein the spontaneous change of resistance of the adaptive photocurrent quenching resistor is accompanied by a reverse bias voltage across the avalanche photodiode varying from a first value that is greater in magnitude than the threshold reverse breakdown bias voltage of the P-N junction, to a second value that is smaller in magnitude than the threshold reverse breakdown bias voltage of the P-N junction, and followed by reverting back to the first value, before, during, and after the photocurrent pulse is quenched.

14. The photodetector of claim 12, wherein a duration during which the photocurrent pulse is quenched is determined by the low resistance of the adaptive photocurrent quenching resistor and a photodetector junction capacitance of the avalanche photodiode.

15. The photodetector of claim 14, wherein the duration during which the photocurrent pulse is quenched is 100 nanosecond or faster.

16. The photodetector of claim 12, wherein the low resistance is between one and fifteen orders of magnitude lower than the high resistance for the adaptive photocurrent quenching resistor.

17. The photodetector of claim 12, wherein the dielectric layer of the adaptive photocurrent quenching resistor resembles a near-insulator when a low voltage below a transition voltage for the dielectric layer is applied and develops the electrical filamentary formation when a high voltage above the transition voltage is applied.

18. The photodetector of claim 17, wherein the electrical filamentary formation comprises a bulk effect in the dielectric layer resulting in a change in a bulk electrical conductivity of the dielectric layer as a function of a voltage applied across the dielectric layer.

19. The photodetector of claim 1, wherein the reversible bias-dependent electrical filamentary formation causes a reversible electrical conduction breakdown within the dielectric layer.

20. The photodetector of claim 1, wherein the dielectric layer comprises an oxide of Al, a hydroxide of Al, a mixed oxide and hydroxide of Al, an oxide of one or more of Hf, Zr, Y, La, Ti, Ce, Sm, Er, Yb, Ta, or V, a hydroxide of one or more of Hf, Zr, Y, La, Ti, Ce, Sm, Er, Yb, Ta, or V, or a mixed oxide and hydroxide of one of more of Hf, Zr, Y, La, Ti, Ce, Sm, Er, Yb, Ta, or V.

\* \* \* \* \*